(12) United States Patent
Ho et al.

(10) Patent No.: US 11,588,081 B2
(45) Date of Patent: Feb. 21, 2023

(54) SEMICONDUCTOR DEVICE PACKAGE

(71) Applicant: Advanced Semiconductor Engineering, Inc., Kaohsiung (TW)

(72) Inventors: Hsin-Ying Ho, Kaohsiung (TW); Hsun-Wei Chan, Kaohsiung (TW); Shih-Chieh Tang, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 288 days.

(21) Appl. No.: 16/809,506

(22) Filed: Mar. 4, 2020

(65) Prior Publication Data
US 2021/0280755 A1 Sep. 9, 2021

(51) Int. Cl.
*H01L 33/58* (2010.01)

(52) U.S. Cl.
CPC ..................................... *H01L 33/58* (2013.01)

(58) Field of Classification Search
CPC ...................................................... H01L 33/58
See application file for complete search history.

(56) References Cited

U.S. PATENT DOCUMENTS

| 2011/0234942 | A1* | 9/2011 | Nakagome | G02B 5/0231 |
| | | | | 349/64 |
| 2016/0320615 | A1* | 11/2016 | Nakamura | G02B 27/0961 |
| 2018/0347797 | A1* | 12/2018 | Nicholas | G01J 1/58 |
| 2018/0375001 | A1* | 12/2018 | Ueno | H01S 5/0683 |
| 2022/0006268 | A1* | 1/2022 | Kondo | H01S 5/18358 |

* cited by examiner

*Primary Examiner* — Jay C Chang
*Assistant Examiner* — Mikka Liu
(74) *Attorney, Agent, or Firm* — Foley & Lardner LLP

(57) ABSTRACT

A semiconductor device package includes a light-emitting device, a diffuser structure, a first optical sensor, and a second optical sensor. The light-emitting device has a light-emitting surface. The diffuser structure is above the light-emitting surface of the light-emitting device. The first optical sensor is disposed below the diffuser structure, and the first optical sensor is configured to detect a first reflected light reflected by the diffuser structure. The second optical sensor is disposed below the diffuser structure, and the second optical sensor is configured to detect a second reflected light reflected by the diffuser structure.

12 Claims, 25 Drawing Sheets

SEMICONDUCTOR DEVICE PACKAGE

BACKGROUND

1. Technical Field

The present disclosure relates generally to a semiconductor device package. More particularly, the present disclosure relates to a semiconductor device package including an optical sensor.

2. Description of the Related Art

Flood illuminators project a flood of light onto the surrounding environment, and the light is at least partially reflected by the surrounding environment and detected by sensors. A flood illuminator may include vertical cavity surface emitting lasers (VCSELs) and a diffuser over the VCSELs, and it can emit light with a desired emitting pattern and therefore is widely used in recent years. However, the light directly emitted by the VCSELs has a relatively small beam angle with a relatively high intensity, and thus when the diffuser fails to function normally, the light emitted by the VCSELs can be dangerous to human eyes.

SUMMARY

In one or more embodiments, a semiconductor device package includes a light-emitting device, a diffuser structure, a first optical sensor, and a second optical sensor. The light-emitting device has a light-emitting surface. The diffuser structure is above the light-emitting surface of the light-emitting device. The first optical sensor is disposed below the diffuser structure, and the first optical sensor is configured to detect a first reflected light reflected by the diffuser structure. The second optical sensor is disposed below the diffuser structure, and the second optical sensor is configured to detect a second reflected light reflected by the diffuser structure.

In one or more embodiments, a semiconductor device package includes a light-emitting device, a diffuser structure, and an optical sensor. The light-emitting device has a light-emitting surface. The light-emitting surface of the light-emitting device has a first side and a second side angled with the first side, and a length of the first side of the light-emitting surface is greater than a length of the second side of the light-emitting surface. The diffuser structure is above the light-emitting surface of the light-emitting device. The optical sensor is disposed below the diffuser structure and adjacent to the first side of the light-emitting surface. The optical sensor is configured to detect a reflected light reflected by the diffuser structure.

In one or more embodiments, a semiconductor device package includes a light-emitting device, a diffuser structure, and an optical sensor. The diffuser structure is above the light-emitting device. A light emitted by the light-emitting device and reflected by the diffuser structure forms a luminous intensity pattern. The luminous intensity pattern has a first region having a maximum light intensity and a second region having a light intensity that is about 10% to about 30% of the maximum light intensity of the first region. The optical sensor is disposed in the second region of the luminous intensity pattern, and the optical sensor is configured to detect a reflected light reflected by the diffuser structure.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
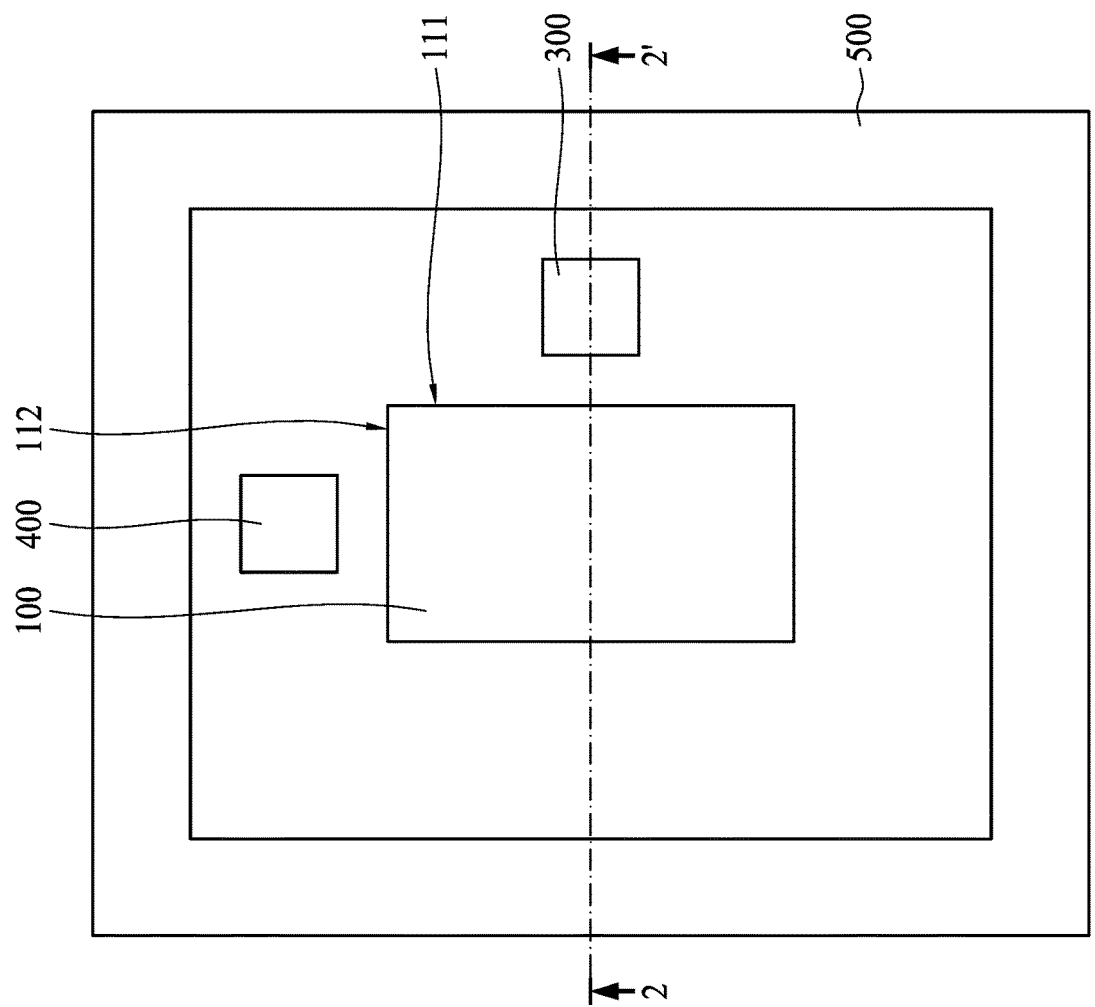
FIG. 1 illustrates a top view of a semiconductor device package in accordance with some embodiments of the present disclosure.
Figure 2:
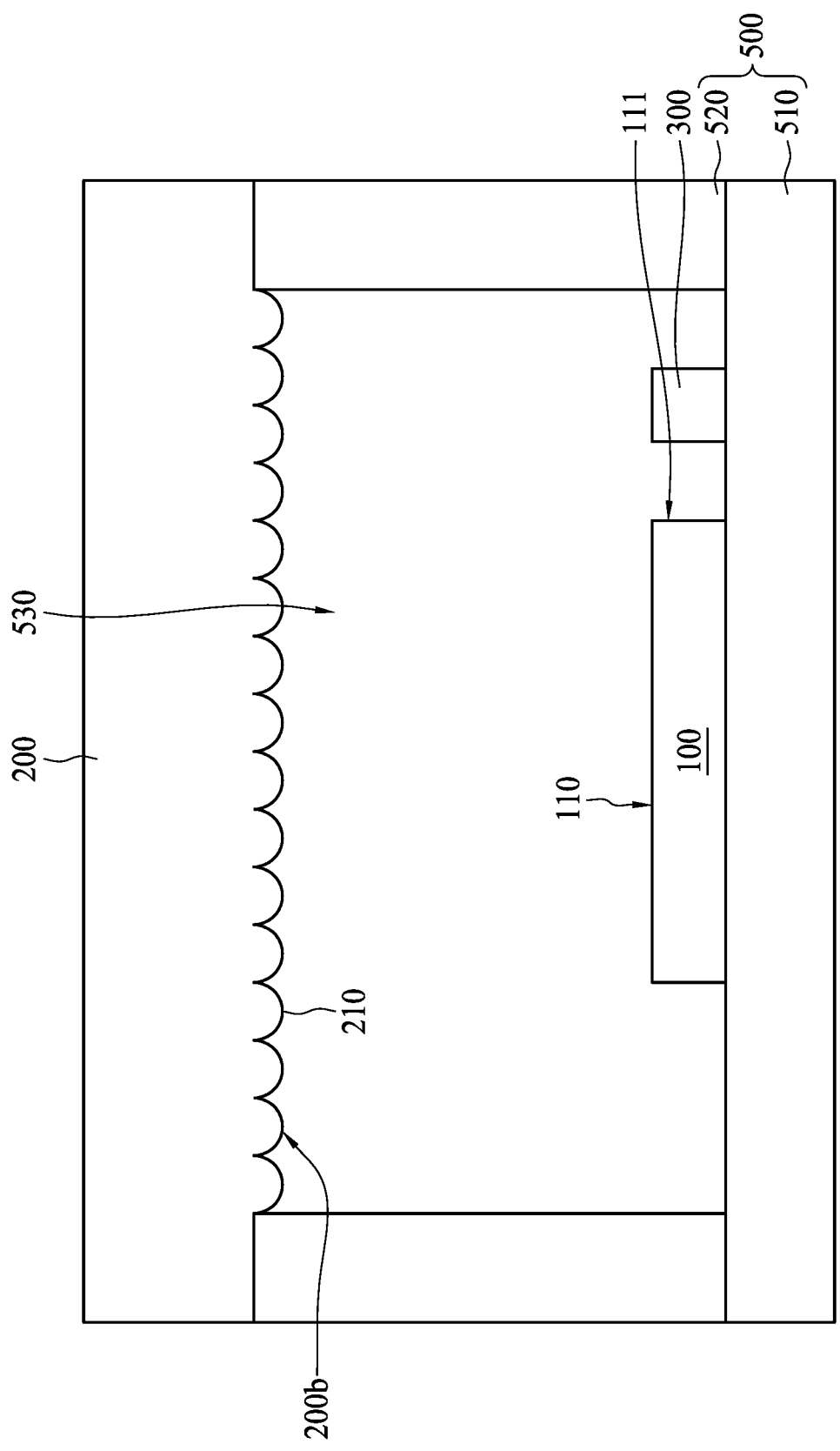
FIG. 2 illustrates a cross-sectional view along the cross-sectional line 2-2' in FIG. 1 in accordance with some embodiments of the present disclosure.

FIG. 1 illustrates a top view of a semiconductor device package 10 in accordance with some embodiments of the present disclosure. FIG. 2 illustrates a cross-sectional view along the cross-sectional line 2-2' in FIG. 1 in accordance with some embodiments of the present disclosure. The semiconductor device package 10 includes a light-emitting device 100, a diffuser structure 200, one or more optical sensors (e.g., optical sensors 300 and 400), a housing structure 500, and a processing unit (not shown in drawings).

The light-emitting device 100 has a light-emitting surface 110. In some embodiments, the light-emitting surface 110 of the light-emitting device 100 has a side 111 (also referred to as "a first side") and a side 112 (also referred to as "a second side") angled with the side 111. In some embodiments, a length of the side 111 of the light-emitting surface 110 is greater a length of the side 112 of the light-emitting surface 110. In some embodiments, the light-emitting device 100 includes a surface light-emitting laser element. In some embodiments, the surface light-emitting laser element is a vertical cavity surface emitting laser (VCSEL). For example, the light-emitting device 100 may include an array of VCSELs.

The diffuser structure 200 is located above the light-emitting surface 110 of the light-emitting device 100. In some embodiments, the diffuser structure 200 includes a microstructure 210 on a surface 200b (also referred to as "a first surface") facing the light-emitting surface 110 of the light-emitting device 100. In some embodiments, the microstructure 210 is formed of or includes a micro lens array. The diffuser structure 200 may diffuse the light emitted by the light-emitting device 100 (e.g., VCSELs) to expand the beam angle and homogenize the intensity of light spread within the beam angle.

The optical sensor 300 is disposed below the diffuser structure 200, and the optical sensor 300 is configured to detect a reflected light (also referred to as "a first reflected light") reflected by the diffuser structure 200. In some embodiments, the optical sensor 300 is disposed adjacent to the side 111 (i.e., the side having a greater length) of the light-emitting surface 110. In some embodiments, the optical sensor 300 is configured to detect a light intensity of the detected reflected light (also referred to as "a first light intensity of the first reflected light").

In some embodiments, the optical sensor 400 is further disposed below the diffuser structure 200, and the optical sensor 400 is configured to detect a reflected light (also referred to as "a second reflected light") reflected by the diffuser structure 200. In some embodiments, the optical sensor 400 is disposed adjacent to the side 112 (i.e., the side having a smaller length) of the light-emitting surface 110. In some embodiments, the reflected light detected by the optical sensor 400 is different from the reflected light detected by the optical sensor 300. In some embodiments, the optical sensor 400 is configured to detect a light intensity of the detected reflected light (also referred to as "a second light intensity of the second reflected light"). In other words, in some embodiments, the optical sensors 300 and 400 are disposed on the sides 111 and 112 having different lengths of the light-emitting surface 110, respectively, and detect different reflected lights reflected by the diffuser structure 200.

In some embodiments, the housing structure 500 includes a base layer 510 and a wall structure 520 disposed on the base layer 510. In some embodiments, the diffuser structure 200 is disposed on the housing structure 500, and the housing structure 500 and the diffuser structure 200 define an enclosing space 530 to accommodate the light-emitting device 100 and the one or more optical sensors 300 and 400. In some embodiments, the wall structure 520 surrounds the light-emitting device 100 and the one or more optical sensors 300 and 400. In some embodiments, the light-emitting device 100 and the one or more optical sensors 300 and 400 are sealed within the enclosing space 530.

In some embodiments, the processing unit may be coupled to the one or more optical sensors 300 and 400. In some embodiments, the processing unit is configured to generate a relative change in light intensity ($\Delta I1$) according to the light intensity of the reflected light detected by the optical sensor 300 (also referred to as "a first relative change in light intensity"). In some embodiments, the relative change in light intensity $\Delta I1$ is obtained by comparing the light intensity of the reflected light detected by the optical sensor 300 and a reference light intensity value stored in a database, the reference light intensity value being the light intensity measured as the diffuser structure 200 functions normally and stored in the database in advance. In some embodiments, the change in light intensity $\Delta I1$ is compared with a reference value stored in the database, and it is determined that the diffuser structure 200 has fallen off if the relative change in light intensity $\Delta I1$ exceeds the reference value, indicating a significant drop in the reflected light intensity detected. In accordance with some embodiments of the present disclosure, by disposing the optical sensor 300 within the enclosing space 530 of the housing structure 500, whether the diffuser structure 200 fails to function normally can be conveniently verified by the relative change in light intensity $\Delta I1$ generated according to the light intensity of the reflected light detected by the optical sensor 300.

In some embodiments, the processing unit is further configured to generate a relative change in light intensity ($\Delta I2$) according to the light intensity of the reflected light detected by the optical sensor 400 (also referred to as "a second relative change in light intensity"). In some embodiments, the relative change in light intensity $\Delta I2$ is obtained by comparing the light intensity of the reflected light detected by the optical sensor 400 and the reference light intensity value stored in the database. In some embodiments, the processing unit is configured to determine whether the first relative change in light intensity $\Delta I1$ and the second relative change in light intensity $\Delta I2$ meet a predetermined criterion or not. In some embodiments, it is determined that the diffuser structure 200 has fallen off if both of the relative change in light intensities $\Delta I1$ and $\Delta I2$ are negative and exceed a predetermined value, indicating that the reflected lights detected by the optical sensors 300 and 400 both drop significantly. In some embodiments, it is determined that water condensation occurs on the surface 200b of the diffuser structure 200 if the relative change in light intensity ΔI1 has a positive value and the relative change in light intensity ΔI2 has a negative value.

In cases where water condensation occurs on the surface 200b within the enclosing space 530 of the housing structure 500, the as-formed water droplets may function as a focusing lens to converge emitted lights, rendering the diffuser structure 200 functioning to be unsatisfactory, thus the intensity of the emitted lights may be undesirably increased along the normal direction of the light-emitting surface 110. As a result, the undesirably converged emitted lights caused by the water condensation on the diffuser structure 200 can be dangerous to human eyes. In accordance with some embodiments of the present disclosure, by disposing the optical sensor 300 and the optical sensor 400 adjacent to the sides 111 and 112 of the light-emitting surface 110 within the enclosing space 530 of the housing structure 500, whether water condensation occurs on the diffuser structure 200 within the sealed enclosing space 530 of the housing structure 500 can be conveniently verified by the relative change in light intensities ΔI1 and ΔI2 generated according to the light intensities of the reflected lights detected by the optical sensors 300 and 400. Therefore, the light-emitting device 100 (e.g., VCSELs) may be turned off as soon as water condensation on the diffuser structure 200 is detected, whereby damage to human eyes by the converged emitted lights can be prevented, and thus safety is further improved.

Figure 3:
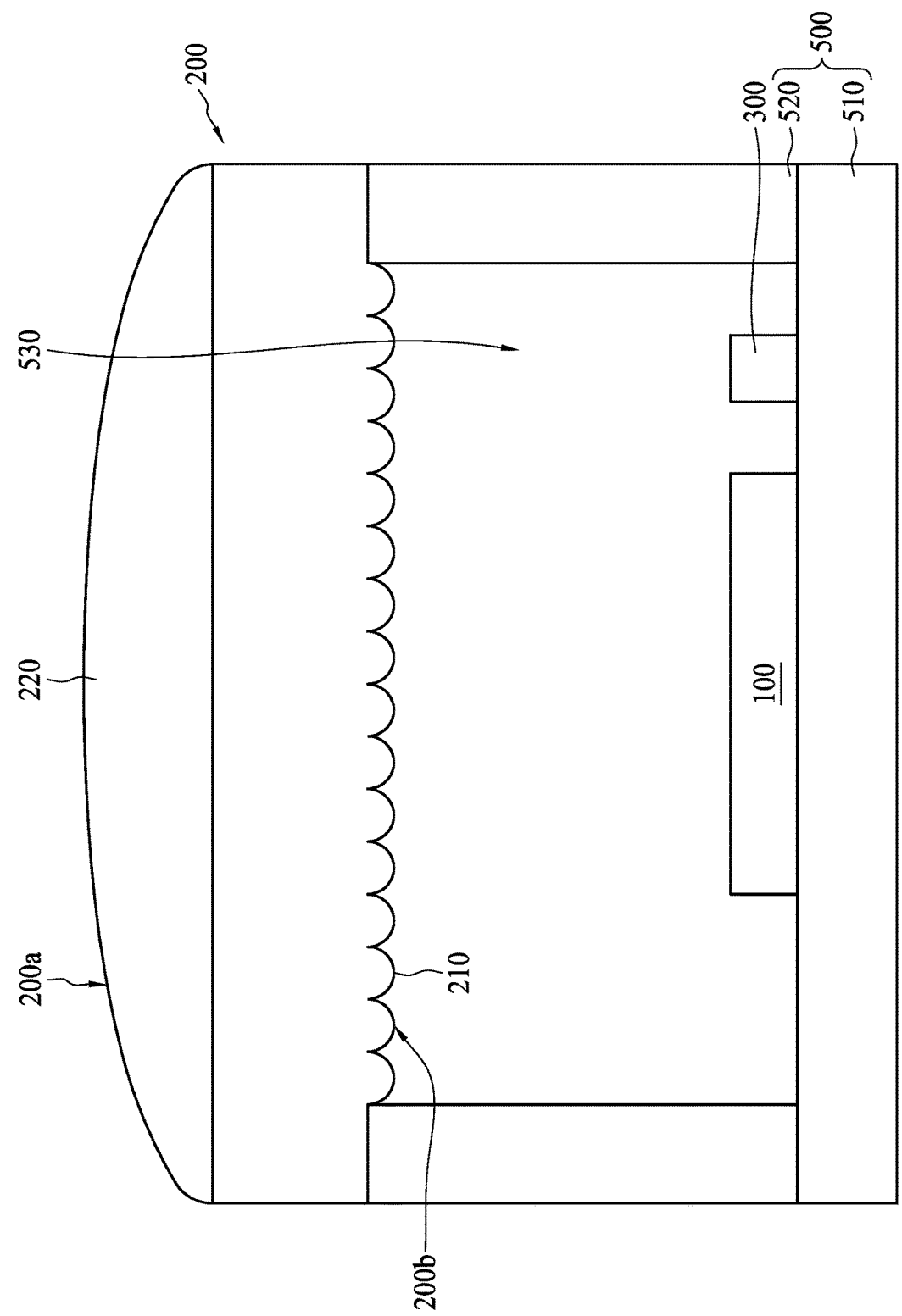
FIG. 3 illustrates a cross-sectional view of a semiconductor device package in accordance with some embodiments of the present disclosure.

FIG. 3 illustrates a cross-sectional view of a semiconductor device package 20 in accordance with some embodiments of the present disclosure. The semiconductor device package 20 is similar to the semiconductor device package 10 shown in FIG. 2 except that, for example, the diffuser structure 200 of the semiconductor device package 20 includes a lens structure 220 on the surface 200a.

The diffuser structure 200 has a surface 200a (also referred to as "a second surface") opposite to the surface 200b. In some embodiments, the diffuser structure 200 includes a convex lens on the surface 200a. In other words, in some embodiments, the lens structure 220 may include a convex lens on the surface 200a. In some embodiments, the convex surface (e.g., surface 200a) of the lens structure 220 faces away from the light-emitting device 100. The lens structure 200 may further diffuse the light emitted by the light-emitting device 100 (e.g., VCSELs) to further expand the beam angle and homogenize the intensity of light spread within the beam angle.

Figure 4:
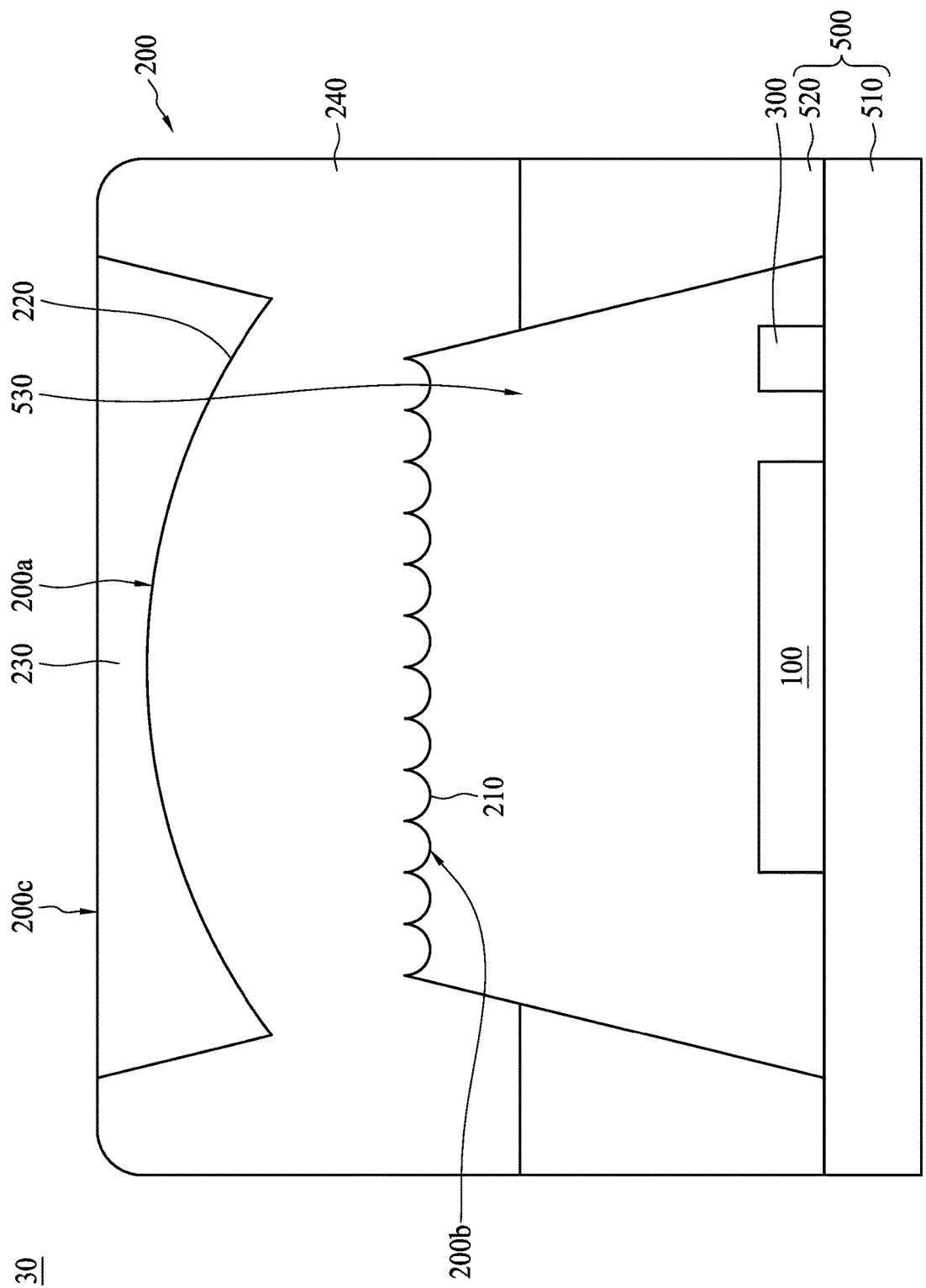
FIG. 4 illustrates a cross-sectional view of a semiconductor device package in accordance with some embodiments of the present disclosure.

FIG. 4 illustrates a cross-sectional view of a semiconductor device package 30 in accordance with some embodiments of the present disclosure. The semiconductor device package 30 is similar to the semiconductor device package 20 shown in FIG. 3 except that, for example, the design of the diffuser structure 200 of the semiconductor device package 30 is different from that of the semiconductor device package 20.

In some embodiments as illustrated in FIG. 4, the diffuser structure 200 includes an upper portion 230 and a lower portion 240 forming an interface, and the convex surface (e.g., surface 200a) is formed from a portion of the interface of the upper portion 230 and the lower portion 240. In some embodiments, the upper portion 230 of the diffuser structure 200 has a surface 200c (also referred to as "an upper surface") facing away from the light-emitting device 100, and the surface 200c is substantially planar. In some embodiments, the lens structure 220 is formed from a portion of the lower portion 240. In some embodiments, the upper portion 230 and the lower portion 240 have different refractive indexes.

Figure 5:
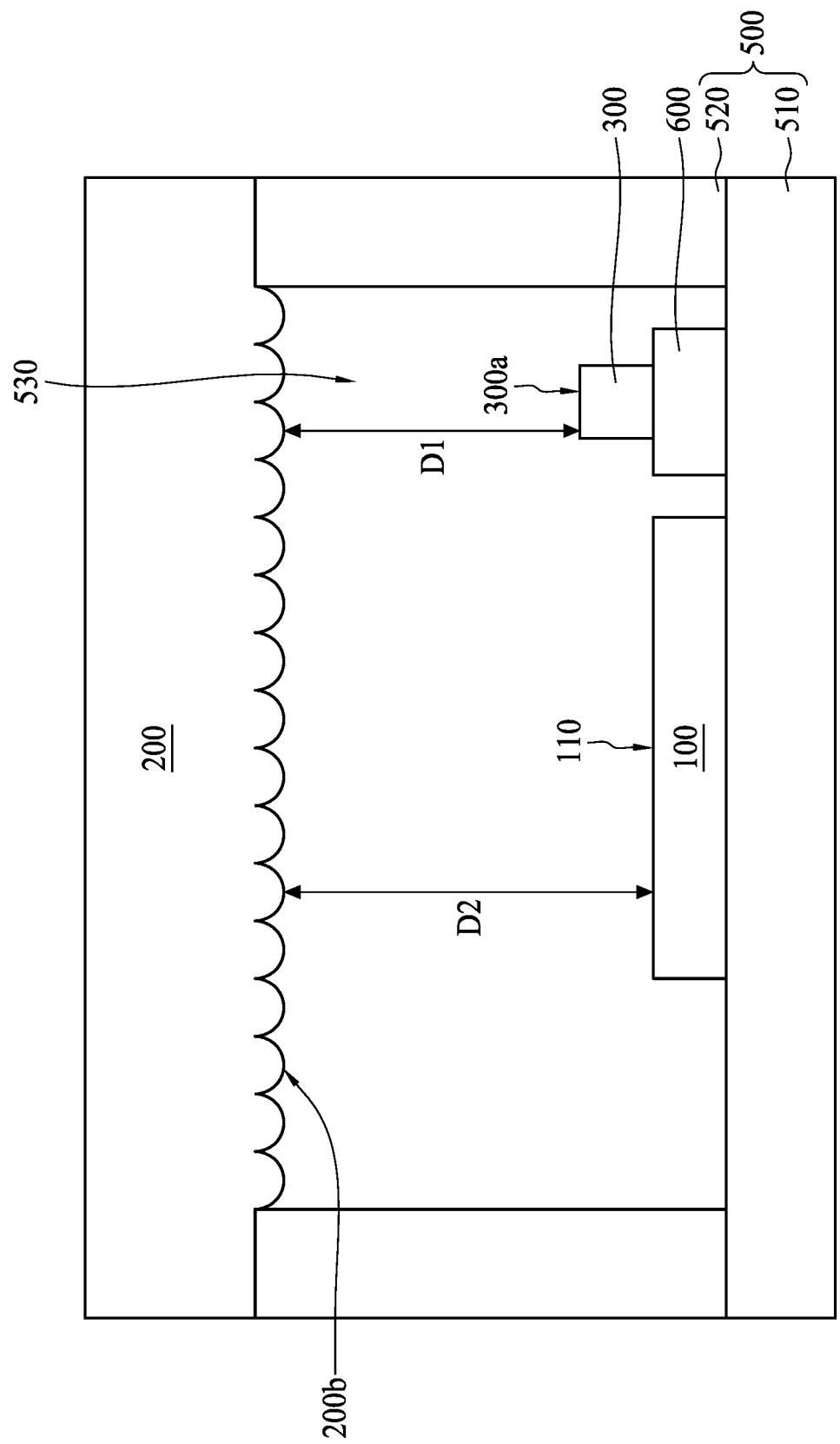
FIG. 5 illustrates a cross-sectional view of a semiconductor device package in accordance with some embodiments of the present disclosure.

FIG. 5 illustrates a cross-sectional view of a semiconductor device package 40 in accordance with some embodiments of the present disclosure. The semiconductor device package 40 is similar to the semiconductor device package 10 shown in FIG. 2 except that, for example, the semiconductor device package 40 includes an elevating layer 600.

In some embodiments, the elevating layer 600 is disposed between the optical sensor 300 and the base layer 510 of the housing structure 500. In some embodiments, the light-emitting device 100 directly contacts the base layer 510 of the housing structure 500. In some embodiments, the elevating layer 600 directly contacts the base layer 510 of the housing structure 500. In some embodiments, a surface 300a (also referred to as "an upper surface") of the optical sensor 300 and the light-emitting surface 110 are at different elevations. In some embodiments, a distance D1 between the surface 200b of the diffuser structure 200 and the surface 300a of the optical sensor 300 is smaller than a distance D2 between the surface 200b of the diffuser structure 200 and the light-emitting surface 110. In accordance with some embodiments of the present disclosure, with the design of the elevating layer 600, the optical sensor 300 is disposed relatively close to the surface 200b of the diffuser structure 200, such that the light intensity detected by the optical sensor 300 can be increased, and the sensitivity of the optical sensor 300 can be increased as well.

Figure 6:
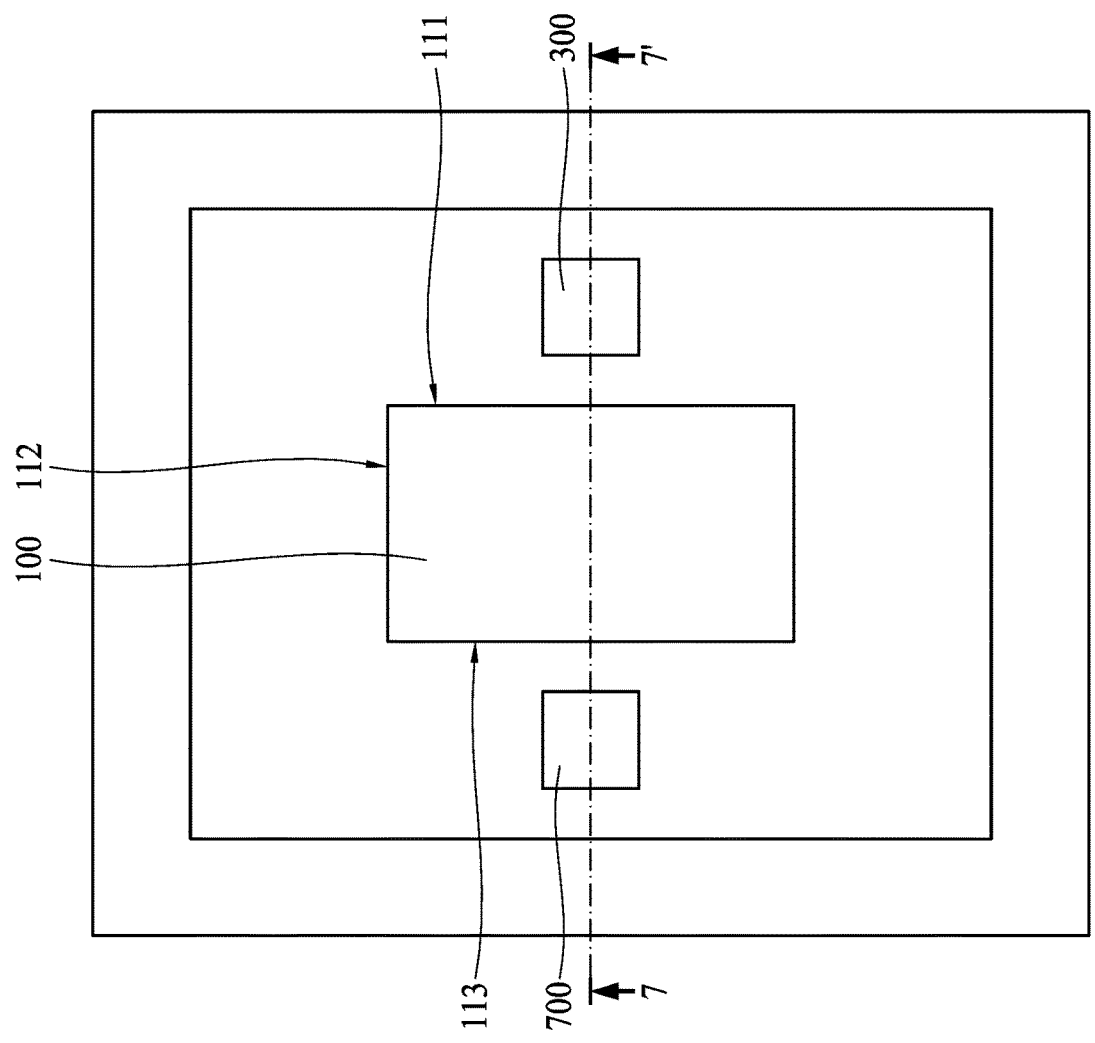
FIG. 6 illustrates a top view of a semiconductor device package in accordance with some embodiments of the present disclosure.
Figure 7:
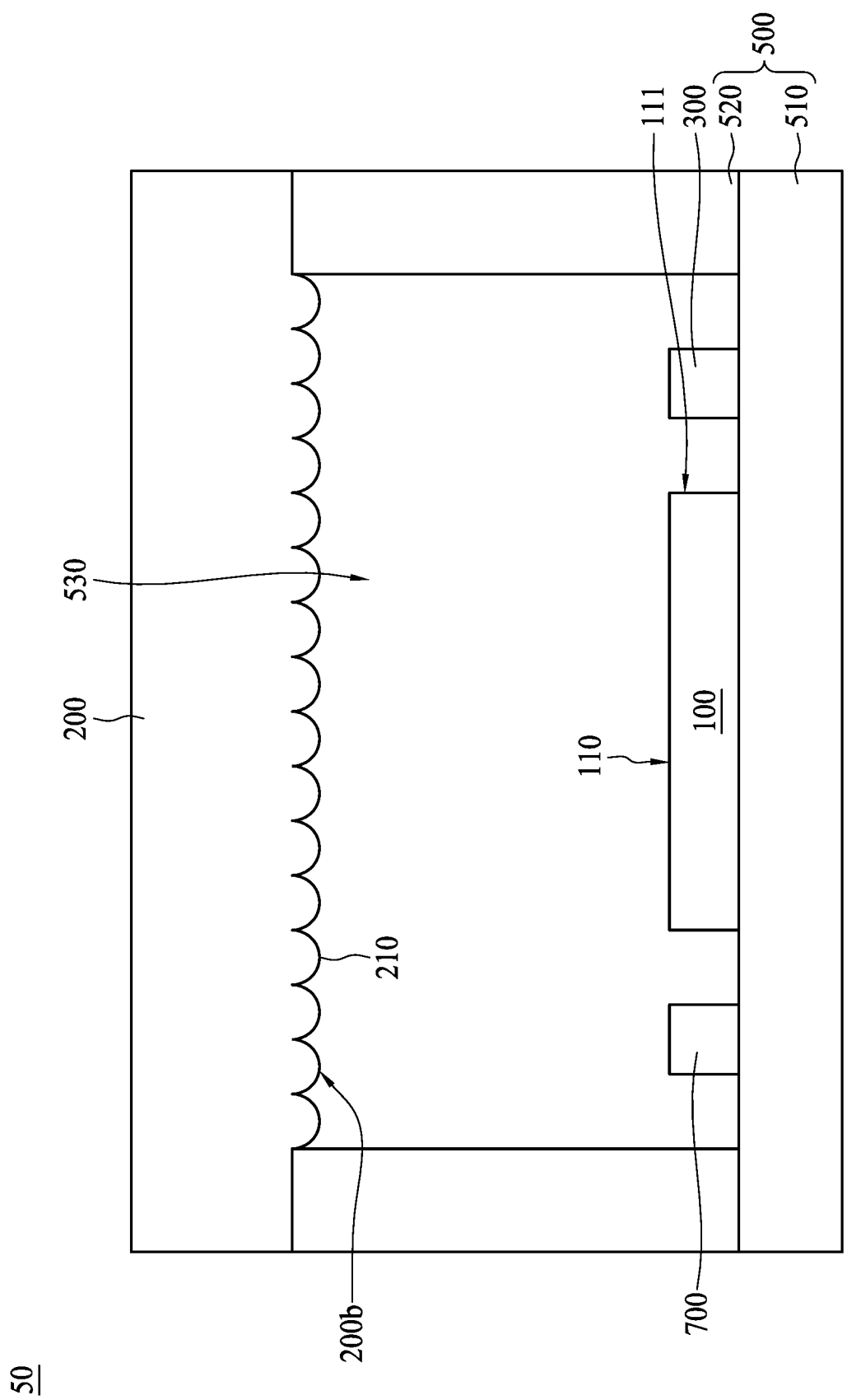
FIG. 7 illustrates a cross-sectional view along the cross-sectional line 7-7' in FIG. 6 in accordance with some embodiments of the present disclosure.

FIG. 6 illustrates a top view of a semiconductor device package 50 in accordance with some embodiments of the present disclosure. FIG. 7 illustrates a cross-sectional view along the cross-sectional line 7-7' in FIG. 6 in accordance with some embodiments of the present disclosure. The semiconductor device package 50 is similar to the semiconductor device package 10 shown in FIGS. 1 and 2 except that, for example, the semiconductor device package 50 includes a temperature sensor 700.

In the embodiments as illustrated in FIGS. 6 and 7, the semiconductor device package 50 includes a light-emitting device 100, a diffuser structure 200, an optical sensor 300, a housing structure 500, and a processing unit (not shown in drawings).

In some embodiments, the temperature sensor 700 is disposed below the diffuser structure 200, and the temperature sensor 700 is configured to detect a temperature of the semiconductor device package 50. The light-emitting surface 110 further has a side 113 opposite to the side 111. In some embodiments as illustrated in FIGS. 6-7, the temperature sensor 700 is disposed adjacent to the side 113 of the light-emitting surface 110. In some other embodiments, the temperature sensor 700 may be disposed adjacent to the side 112 of the light-emitting surface 110. In some embodiments, the temperature sensor 700 includes a thermistor.

In some embodiments, the processing unit may be coupled to the optical sensor 300 and the temperature sensor 700. In some embodiments, the processing unit is configured to generate a relative change in light intensity (ΔI1) according to a light intensity of the reflected light detected by the optical sensor 300 and a relative change in temperature (ΔT) according to the temperature detected by the temperature sensor 700.

In some embodiments, the relative change in temperature ΔT is obtained by comparing a reference temperature value stored in the database and a temperature detected by the temperature sensor 700 at a desired time point, the reference temperature being measured and stored in the database in advance. In some embodiments, the processing unit is configured to determine whether the relative change in light intensity (ΔI1) and the relative change in temperature (ΔT) meet a predetermined criterion or not. In some embodiments, the values of relative change in temperature and corresponding values of relative change in light intensity ΔI1 are stored in a lookup table in the database. In some embodiments, it is determined that the diffuser structure 200 functions normally if the relative change in light intensity (ΔI1) and the relative change in temperature (ΔT) generated by the processing unit match the data in the lookup table, indicating that the relative change in light intensity (ΔI1) obtained is simply caused by the influence on the light-emitting device 100 by the temperature change. In accordance with some embodiments of the present disclosure, by disposing the optical sensor 300 and the temperature sensor 700 within the enclosing space 530 of the housing structure 500, whether the relative change in light intensity ΔI1 is caused by the diffuser structure 200 failing to function normally or simply by the thermal effect of the light-emitting device 100 (e.g., VCSELs) can be conveniently verified by the additional temperature data provided according to the temperature sensor 700, and thus misjudgment of diffuser structure 200 falling off or occurrences of water condensation can be effectively prevented.

Figure 8:
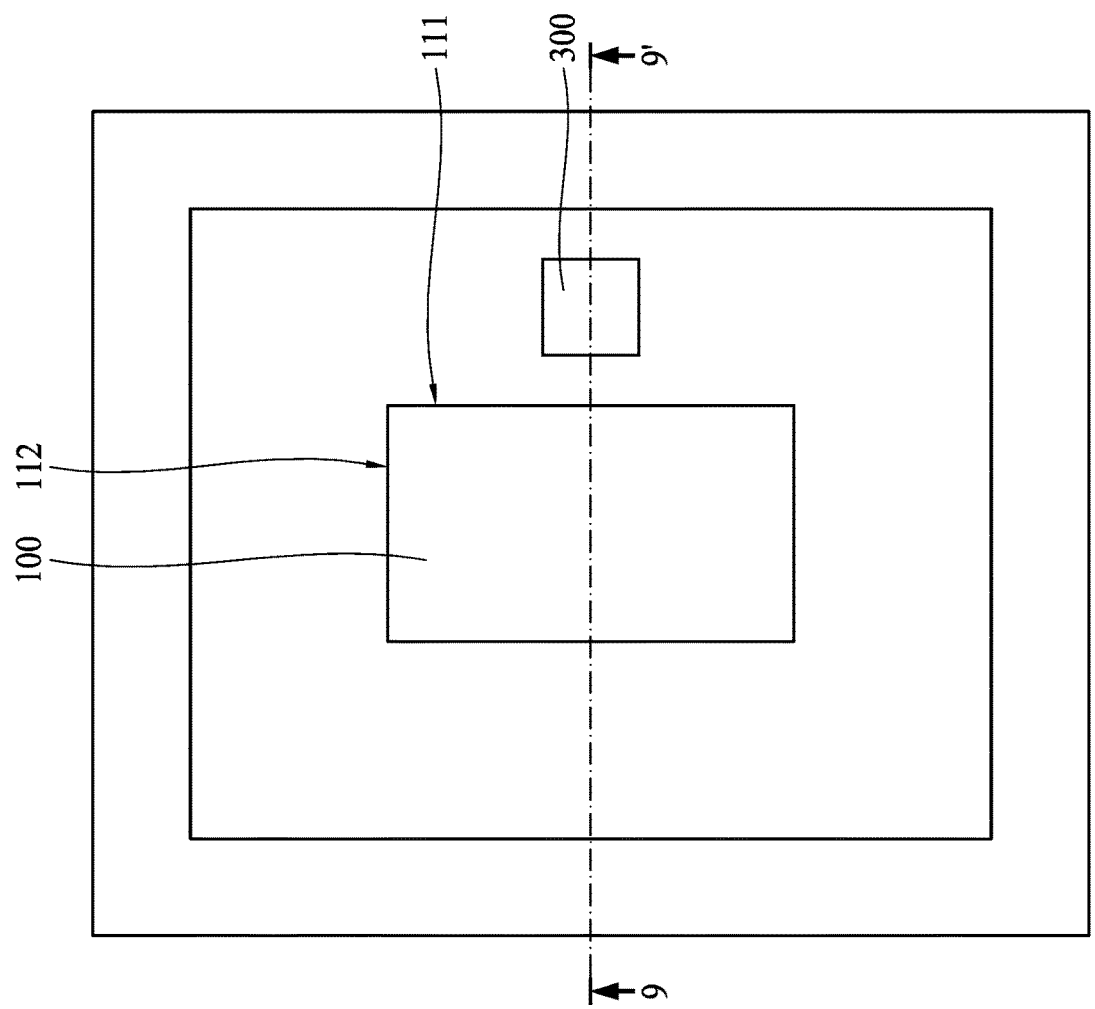
FIG. 8 illustrates a top view of a semiconductor device package in accordance with some embodiments of the present disclosure.
Figure 9:
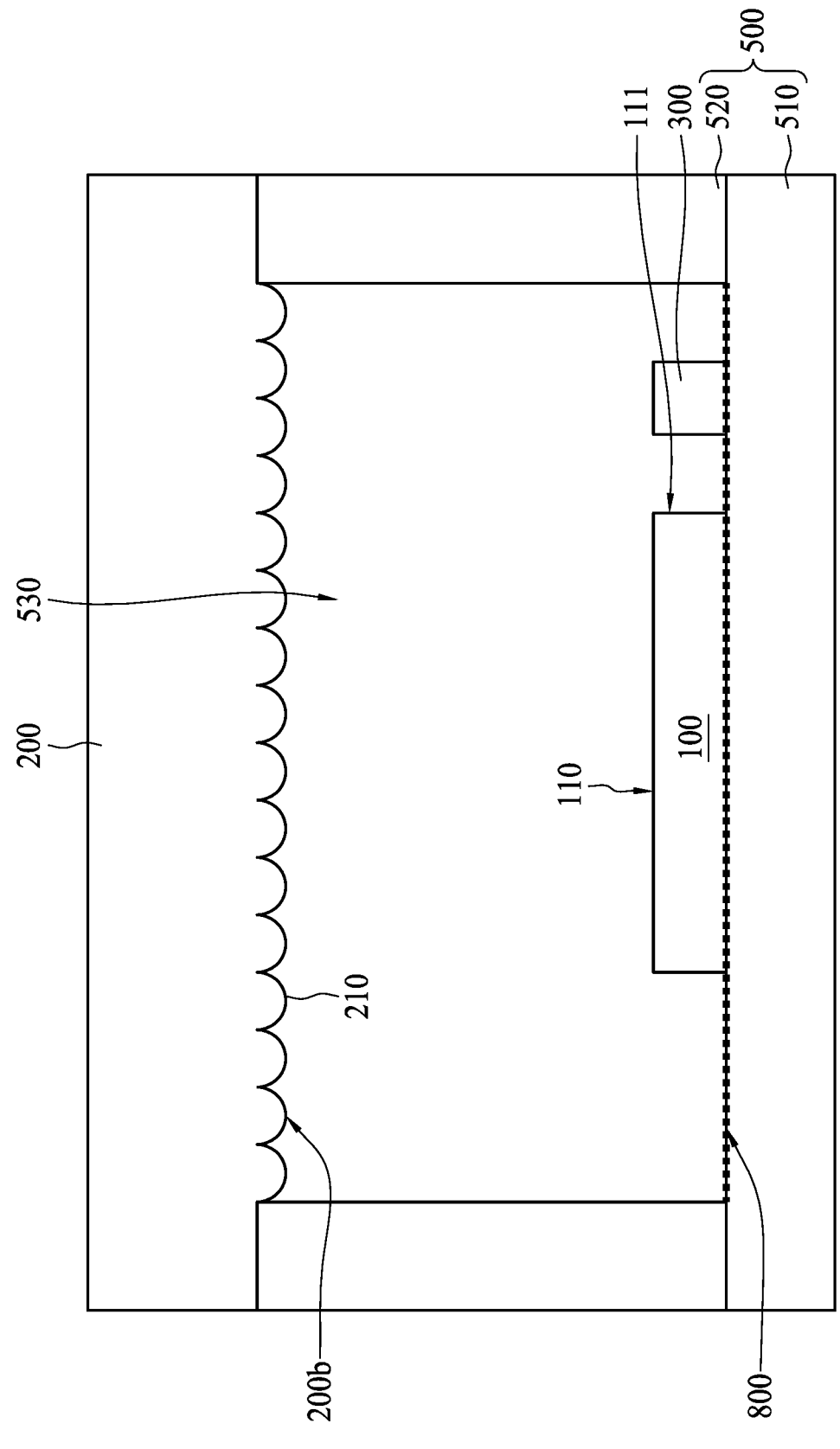
FIG. 9 illustrates a cross-sectional view along the cross-sectional line 9-9' in FIG. 8 in accordance with some embodiments of the present disclosure.
Figure 10:
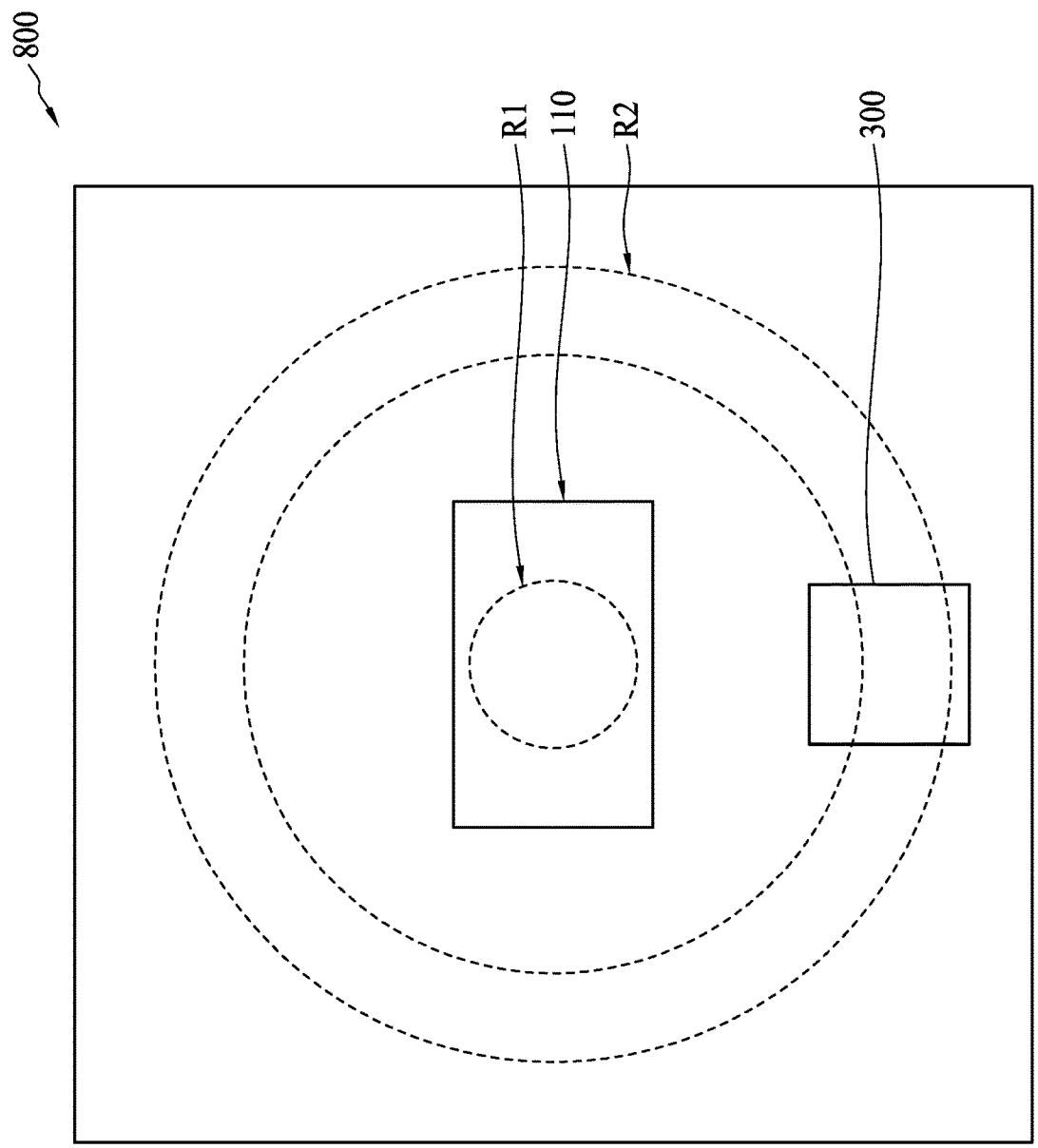
FIG. 10 illustrates a schematic view of a luminous intensity pattern of a semiconductor device package in accordance with some embodiments of the present disclosure.

FIG. 8 illustrates a top view of a semiconductor device package 60 in accordance with some embodiments of the present disclosure. FIG. 9 illustrates a cross-sectional view along the cross-sectional line 9-9' in FIG. 8 in accordance with some embodiments of the present disclosure. FIG. 10 illustrates a schematic view of a luminous intensity pattern 800 of a semiconductor device package 60 in accordance with some embodiments of the present disclosure. The semiconductor device package 60 is similar to the semiconductor device package 10 shown in FIGS. 1 and 2 except that, for example, the optical sensor 300 of the semiconductor device package 60 is arranged corresponding to a luminous intensity pattern 800 of a reflected light.

In some embodiments, a light emitted by the light-emitting device 100 and reflected by the diffuser structure 200 forms the luminous intensity pattern 800. In some embodiments, the luminous intensity pattern 800 has a region R1 (also referred to as "a first region") having a maximum light intensity and a region R2 (also referred to as "a second region") having a light intensity that is about 10% to about 30% of the maximum light intensity of the region R1. In some embodiments, the optical sensor 300 is disposed in the region R2 of the luminous intensity pattern 800. In some embodiments, the light intensity of the region R2 is about 15% to about 25% of the maximum light intensity of the region R1. In some embodiments, the light intensity of the region R2 is about 20% of the maximum light intensity of the region R1.

In some embodiments, the region R2 of the luminous intensity pattern 800 has a substantially circular ring shape and surrounds the region R1 of the luminous intensity pattern 800.

In some embodiments, the processing unit may be coupled to the optical sensor 300. In some embodiments, the processing unit is configured to generate a relative change in light intensity (ΔI1) according to a light intensity of the reflected light detected by the optical sensor 300. In some embodiments, the processing unit is configured to determine whether the relative change in light intensity (ΔI1) meets a predetermined criterion or not. In accordance with some embodiments of the present disclosure, the one or more optical sensors 300 and 400 disposed in the region R2 of the luminous intensity pattern can have a greater sensitivity to the change in light intensity.

In some embodiments, the luminous intensity pattern 800 is projected on the base layer 510 of the housing structure 500. In some embodiments, the optical sensor 300 is disposed on the base layer 510 and located in the region R2 of the luminous intensity pattern 800.

Figure 11:
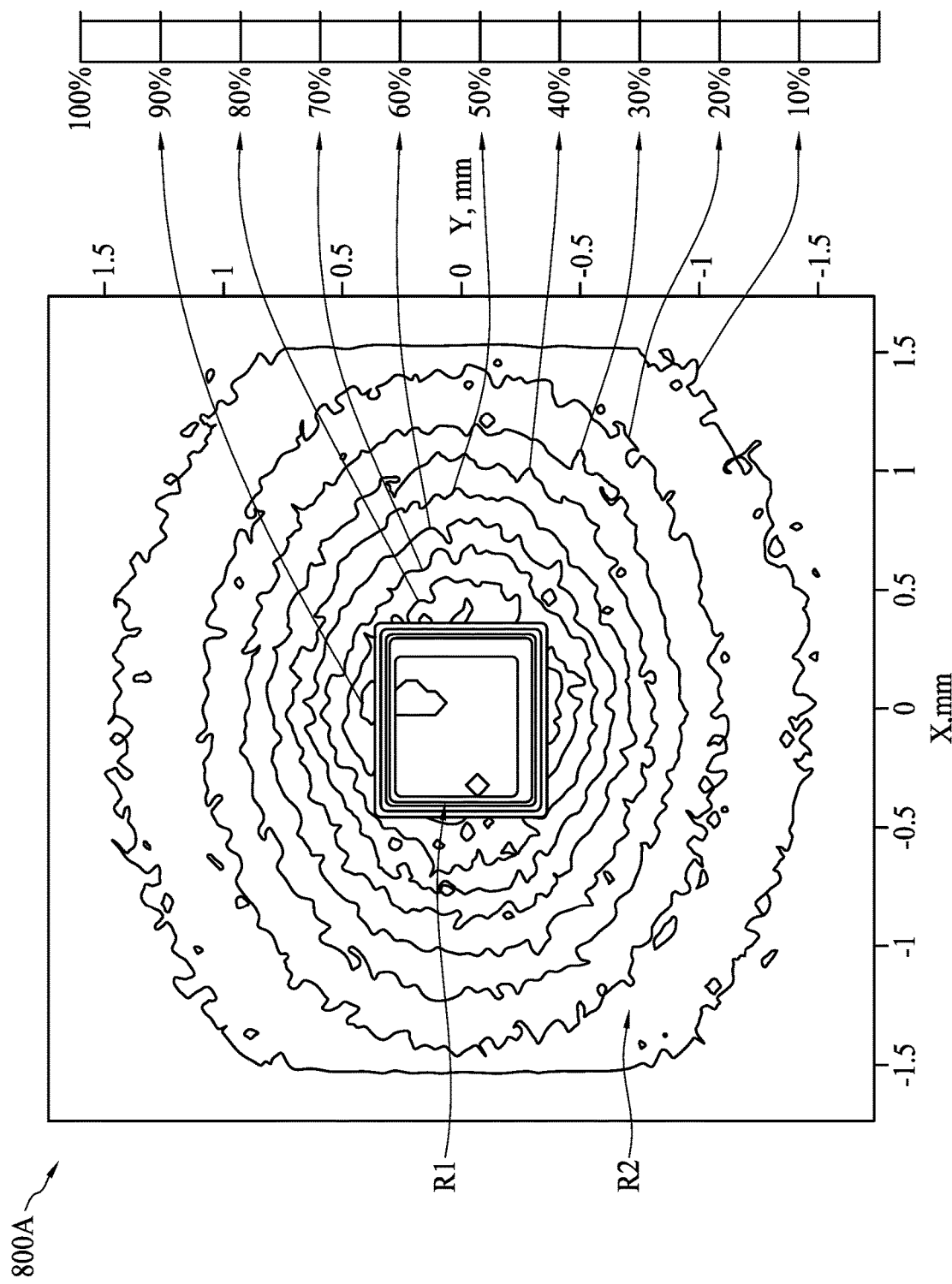
FIG. 11 illustrates a schematic view of a luminous intensity pattern of a semiconductor device package in accordance with some other embodiments of the present disclosure.

FIG. 11 illustrates a schematic view of a luminous intensity pattern 800A of a semiconductor device package in accordance with some other embodiments of the present disclosure. As shown in FIG. 11, the vertical bar denotes the relative light intensities of the boundaries of various regions of the luminous intensity pattern 800A. In some embodiments, the region R1 located at the center of the luminous intensity pattern 800A has a maximum light intensity, for example, of about 90% to about 100%, and the region R2 has a light intensity of about 10% to about 30%. In the embodiments as illustrated in FIG. 11, the region R2 of the luminous intensity pattern 800A has a substantially circular ring shape and surrounds the region R1 of the luminous intensity pattern 800A, and the region R1 has a shape substantially the same as that of the light-emitting surface 110 of the light-emitting device 100.

Figure 12:
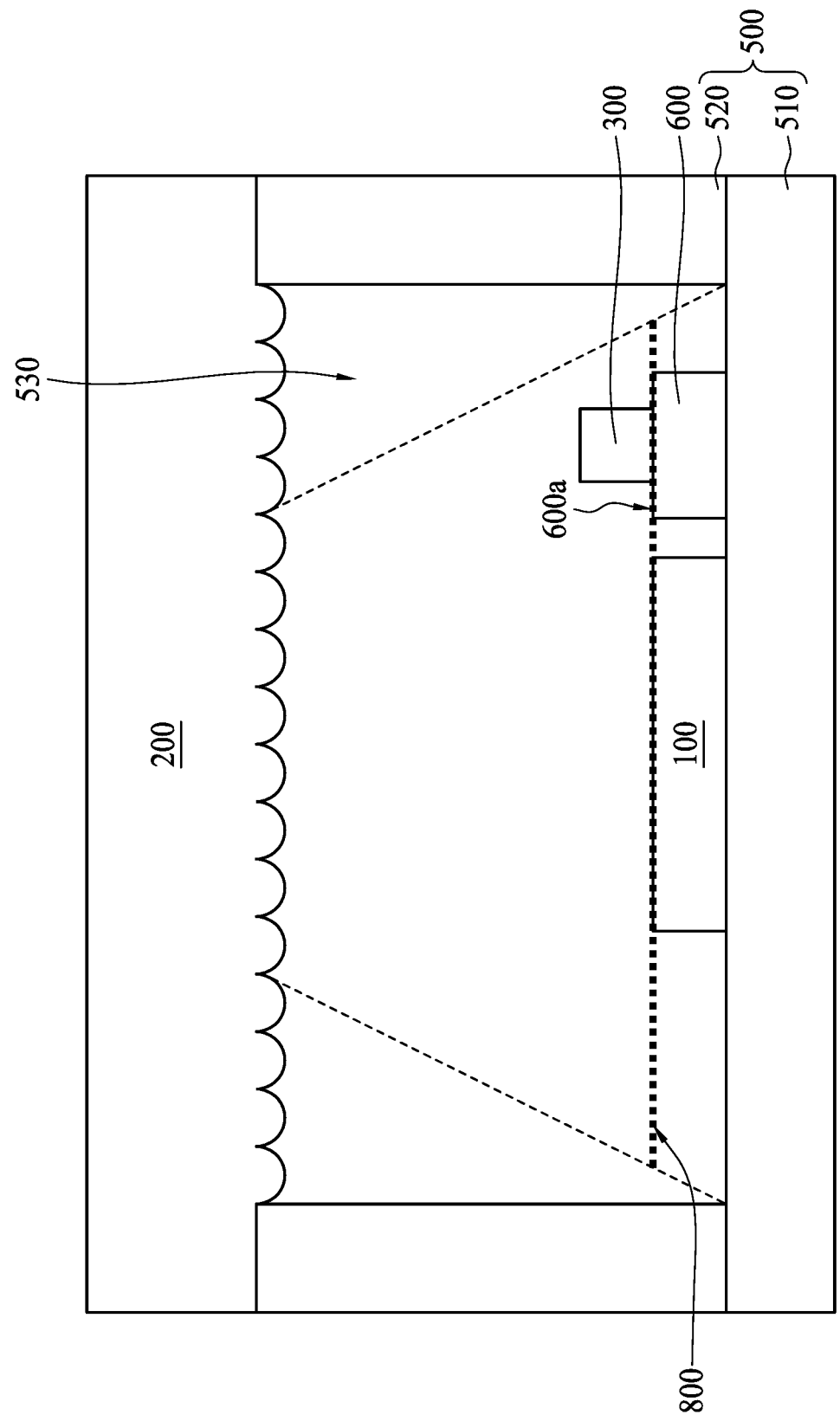
FIG. 12 illustrates a cross-sectional view of a semiconductor device package in accordance with some embodiments of the present disclosure.

FIG. 12 illustrates a cross-sectional view of a semiconductor device package 70 in accordance with some embodiments of the present disclosure. The semiconductor device package 70 is similar to the semiconductor device package 60 shown in FIG. 9 except that, for example, the semiconductor device package 70 includes an elevating layer 600.

In some embodiments, the elevating layer 600 is disposed between the optical sensor 300 and the base layer 510 of the housing structure 500, and the light-emitting device 100 directly contacts the base layer 510 of the housing structure 500. In some embodiments, the luminous intensity pattern 800 is projected on a surface 600a (also refer to as "an upper surface") of the elevation layer 600. In some embodiments, the surface 600a of the elevation layer 600 directly contacts the optical sensor 300 and is located in the region R2 of the luminous intensity pattern 800. In other words, in the embodiments as illustrated in FIG. 12, the optical sensor 300 is located in the region R2 of the luminous intensity pattern 800.

In some embodiments, as the luminous intensity pattern 800 is protected closer to the surface 200b of the diffuser structure 200, the luminous intensity pattern 800 as protected is smaller, and thus the region R2 is closer to the center (e.g., region R1) of the luminous intensity pattern 800 accordingly. In accordance with some embodiments of the present disclosure, the optical sensor 300 is disposed on the elevating layer 600 and located in the region R2 of the luminous intensity pattern 800 projected closer to the surface 200b of the diffuser structure 200, such that the optical sensor 300 can be disposed closer to the light-emitting device 100 in the elevated region R2 while still have an improved sensitivity to the reflected lights, and the sizes of the enclosing space 530 as well as the semiconductor device package can be further reduced.

Presented below are simulation results of exemplary embodiments to further show the properties and advantages of the semiconductor device packages in accordance with some embodiments of the present disclosure. The simulations were performed using LightTools.

Figure 13:
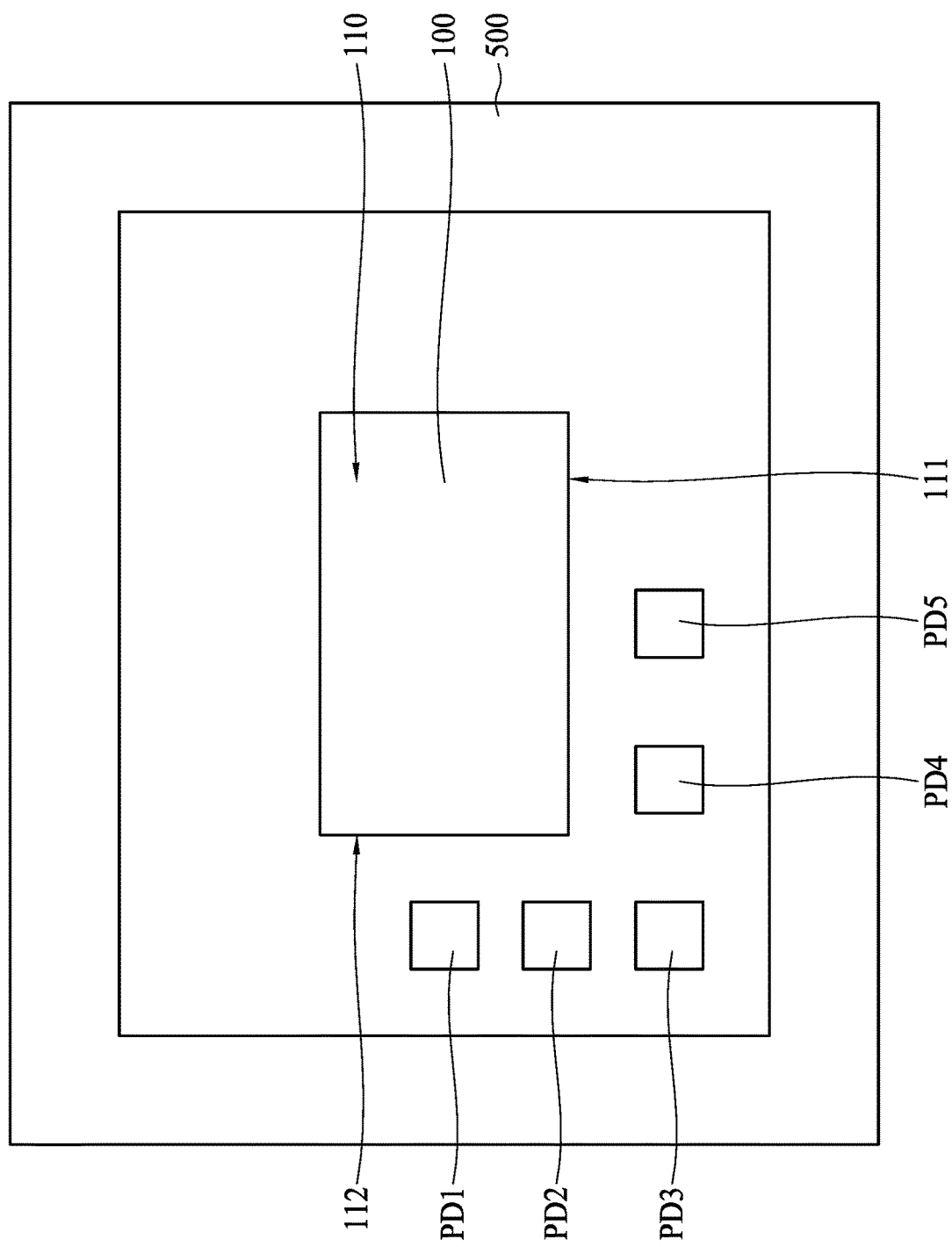
FIG. 13 illustrates a top view of a semiconductor device package in accordance with some embodiments of the present disclosure.

In the following exemplary embodiments, one or more optical sensors may be disposed at various positions PD1-PD5 of a semiconductor device package as illustrated in FIG. 13 according to some embodiments. In the embodiments as illustrated in FIG. 13, the positions PD1 and PD2 are adjacent to the side 112 of the light-emitting surface 110 of the light-emitting device 100, the positions PD 4 and PD 5 are adjacent to the side 111 of the light-emitting surface 110 of the light-emitting device 100, and the side 111 has a greater length than that of the side 112. For example, the optical sensor 300 may be disposed at the position PD5, and the optical sensor 400 may be disposed at the position PD1 in accordance with some embodiments of the present disclosure.

Figure 14:
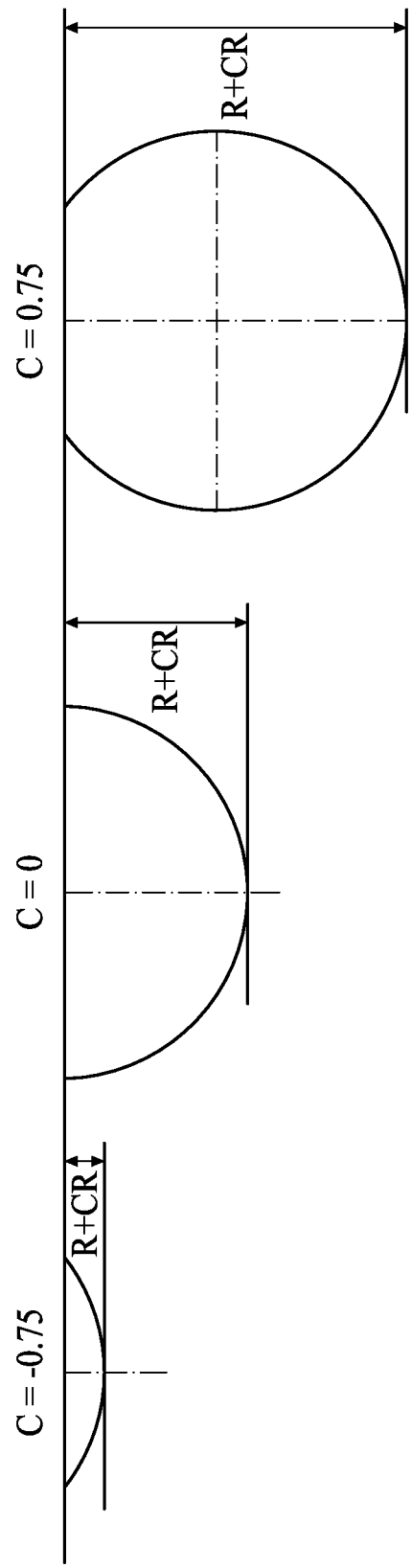
FIG. 14 illustrates the definition of a ratio for droplet contact angle (Ratio C) in accordance with some embodiments of the present disclosure.

In addition, a ratio for droplet contact angle (Ratio C) is defined as illustrated in FIG. 14, and such definition is adopted hereinafter to define the contact angle of water droplets on a diffuser structure of the exemplary semiconductor device packages presented below. Specifically, as shown in FIG. 14, the height of a water droplet is represented by R+CR, wherein R is the radius of the water droplet. When the Ratio C=0, the height of the water droplet represented by R+CR equals R, indicating a contact angle of about 90°; when the Ratio C=0.75, the height of the water droplet is 1.75R, indicating a contact angle that is greater than 90°; when the Ratio C=−0.75, the height of the water droplet is 0.25R, indicating a contact angle that is smaller than 90°.

Table 1 shows the simulation results of exemplary embodiments C1 and E1-E2. Optical sensors are disposed at various positions shown in FIG. 13. A VCSEL light source (e.g., an array of VCSELs) is used as the light-emitting device 100, the light output power is set at 1 W, and the power of reflected lights detected by the optical sensors at positions PD1 and PD5 is listed in table 1.

TABLE 1

| | Water droplet/layer | Power detected at PD1 | Power detected at PD5 | Shape of light pattern |
|---|---|---|---|---|
| C1 | N/A | 33.8 µW | 19.5 µW | Circular |
| E1 | Single water droplet (R = 0.45 mm/ C = 0.5) | 43.0 µW Increased by 127% (compared to C1) | 9.4 µW Decreased by 48% (compared to C1) | Oval |
| E2 | Water layer (thickness of 0.04 mm) | 94.7 µW Increased by 280% (compared to C1) | 6.2 µW Decreased by 32% (compared to C1) | Oval |

From the results shown in table 1, it is apparent that whether a water droplet or even a layer of water is formed can be determined by comparing the power of reflected lights detected by optical sensors at various positions (e.g., exemplary embodiments E1-E2) and a reference value of the power of reflected lights where no water exists (e.g., exemplary embodiment C1). For example, as shown in table 1, when a water droplet or even a layer of water is formed on the diffuser structure within the sealed enclosing space of a semiconductor device package, the power of reflected lights detected by the optical sensor at position PD1 (i.e., adjacent to the relatively long side of the light-emitting surface) is significantly increased, and the power of reflected lights detected by the optical sensor at position PD5 (i.e., adjacent to the relatively short side of the light-emitting surface) is significantly decreased. Accordingly, whether water condensation occurs on the diffuser structure within the semiconductor device package can be determined by verifying if one of the values of the power of reflected lights detected by optical sensors at positions PD1 and PD5 increases, and the other value decreases.

Figure 15A:
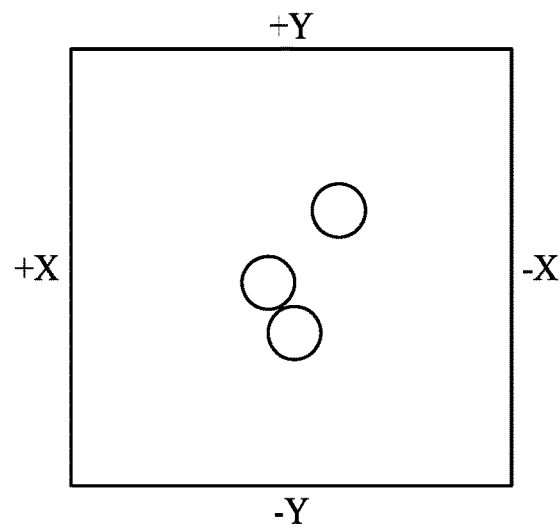
FIG. 15A illustrates a schematic view of water droplets on a diffuser structure of a semiconductor device package in accordance with some embodiments of the present disclosure.
Figure 15B:
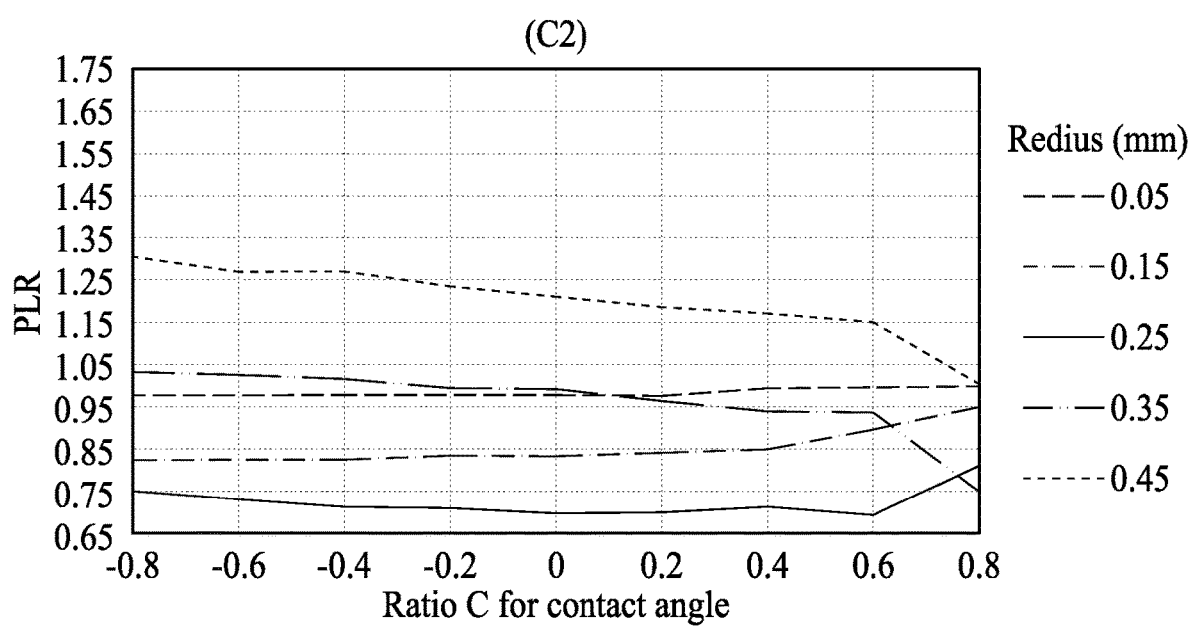
FIG. 15B illustrates the relationship between the Ratio C and the power to limit ratio (PLR) of emitted lights in accordance with some embodiments of the present disclosure.
Figure 15C:
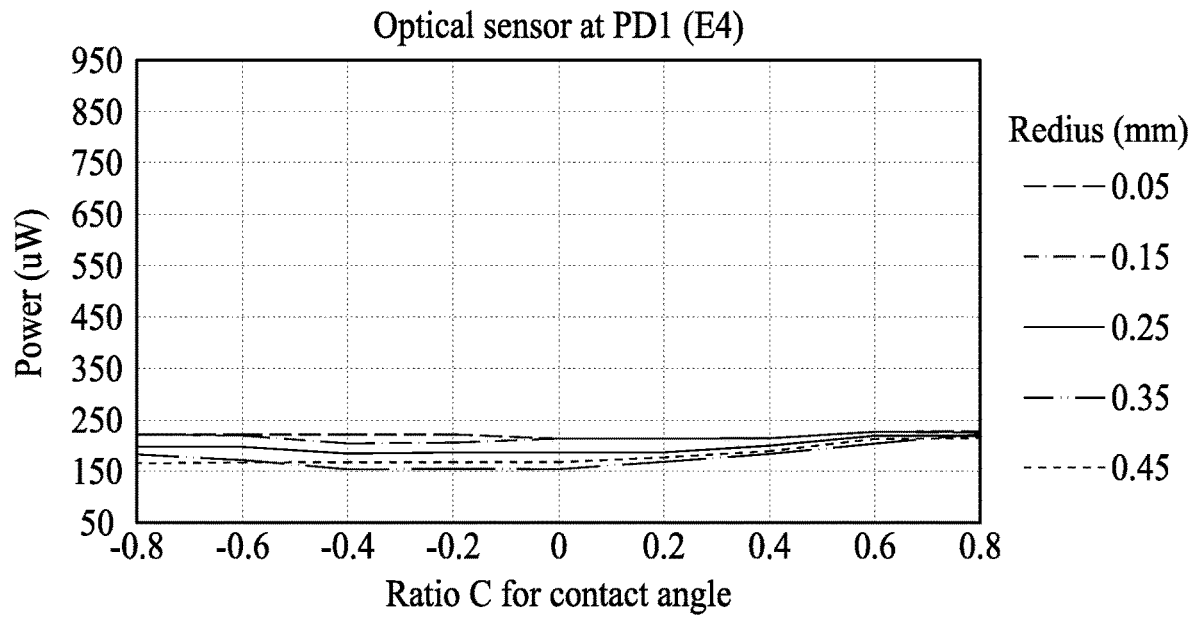
FIG. 15C, FIG. 15D, FIG. 15E, FIG. 15F, and FIG. 15G illustrate the relationships between the Ratio C and the power detected by optical sensors at various positions of a semiconductor device package in accordance with some embodiments of the present disclosure.
Figure 15D:
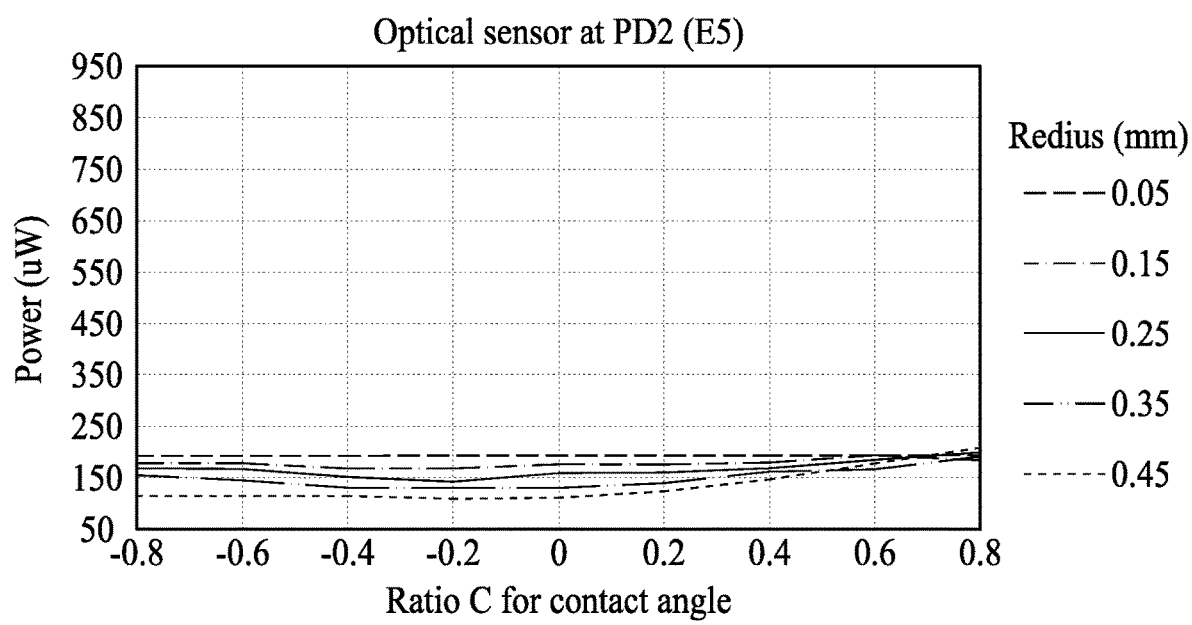
Figure 15E:
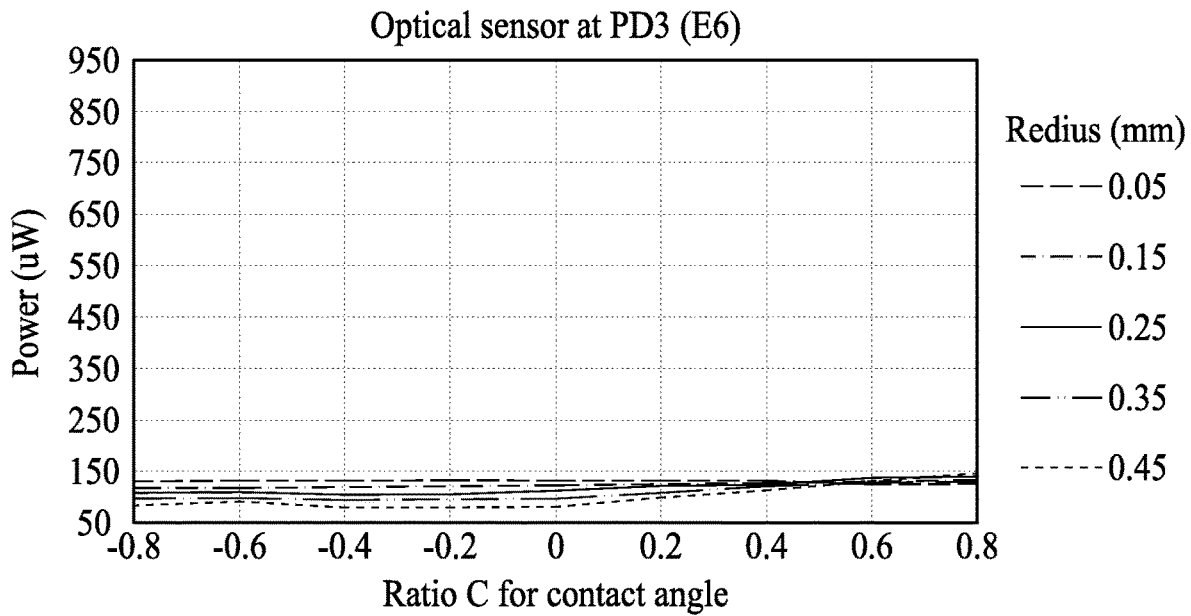
Figure 15F:
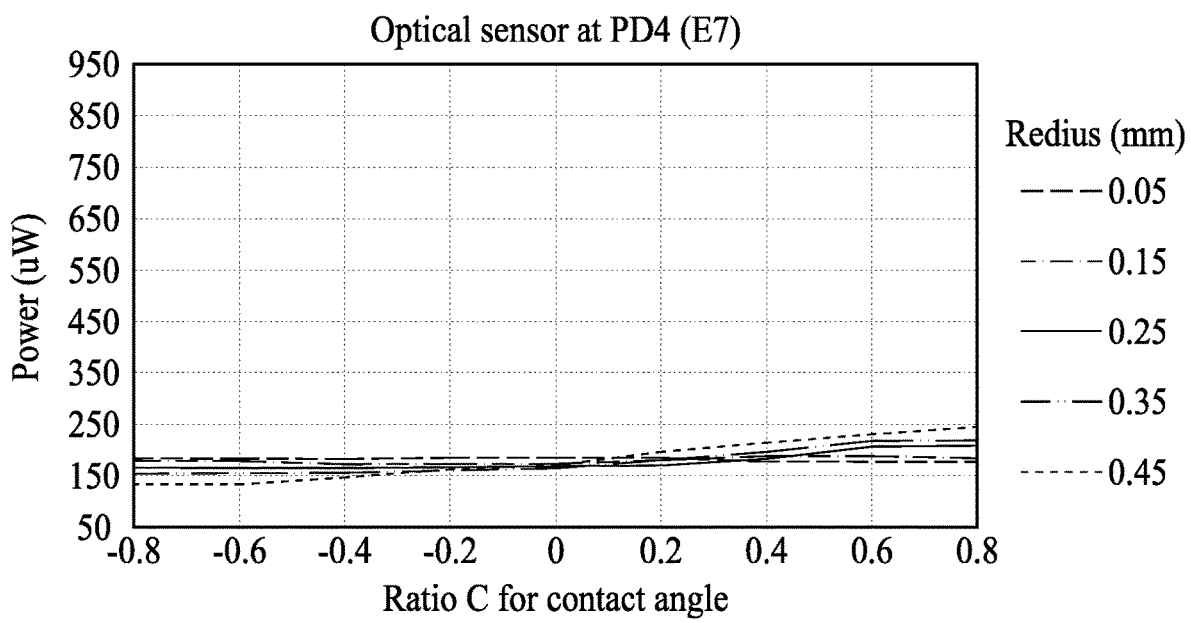

FIGS. 15B, 15C, 15D, 15E, 15F, and 15G show the simulation results of exemplary embodiments C2 and E4-E8 of the present disclosure. Referring to FIG. 13, optical sensors are disposed at positions PD1-PD5 for exemplary embodiments E4-E8, respectively. For exemplary embodiments E4-E8, three water droplets are located on a diffuser structure in an arrangement as shown in FIG. 15A, and the relative coordinates of the three water droplets are listed in table 2. FIG. 15B illustrates the relationship between the Ratio C and the power to limit ratio (PLR) of emitted lights of exemplary embodiment C2. FIGS. 15C, 15D, 15E, 15F, and 15G illustrate the relationships between the Ratio C and the power detected by optical sensors at positions PD1, PD2, PD3, PD4, and PD5 for exemplary embodiments E4, E5, E6, E7, and E8, respectively. Each of the exemplary embodiments is further provided with five simulation curves, each representing the three water droplets with a radius of 0.05 mm, 0.15 mm, 0.25 mm, 0.35 mm, and 0.45 mm.

TABLE 2

| | X(mm) | Y(mm) |
|---|---|---|
| Water droplet 1 | −0.2 | 0.2 |
| Water droplet 2 | 0.1 | −0.1 |
| Water droplet 3 | 0 | −0.3 |

As illustrated in FIG. 15B, the simulation curve representing the three water droplets with a radius of 0.45 mm shows a greatest PLR level of emitted lights. While PLR is defined by the proportionate power within an area (e.g., a rectangular area on an image) to the circumference of this area, a thermal injury may occur if PLR is above an emission limit. Thus, from the results shown in FIG. 15B, water droplets with a greater radius generate a higher PLR level of emitted lights.

Exemplary embodiments E4, E5, E6, E7, and E8 present the simulation results of the power of reflected lights detected by optical sensors adjacent to the light-emitting device. From the simulation results of exemplary embodiments E4-E8 shown in FIGS. 15C-15G, respectively, the power levels of reflected lights detected by optical sensors at different positions PD1, PD2, PD3, PD4, and PD5 vary significantly. While the curves referring to the power detected by the optical sensors at positions PD1 and PD2 (i.e., adjacent to the relatively short side of the light-emitting surface) are smooth with relatively low power levels, the curves referring to the power detected by the optical sensor at position PD5 (i.e., adjacent to the relatively long side of the light-emitting surface) show significantly higher power values. Accordingly, whether water droplets are formed on the diffuser structure within the semiconductor device package can be determined by comparing the power of reflected lights detected by optical sensors at various positions (e.g., positions PD1 and PD5) and verifying if the difference between the power values detected from different positions exceeds a predetermined level.

Figure 15G:
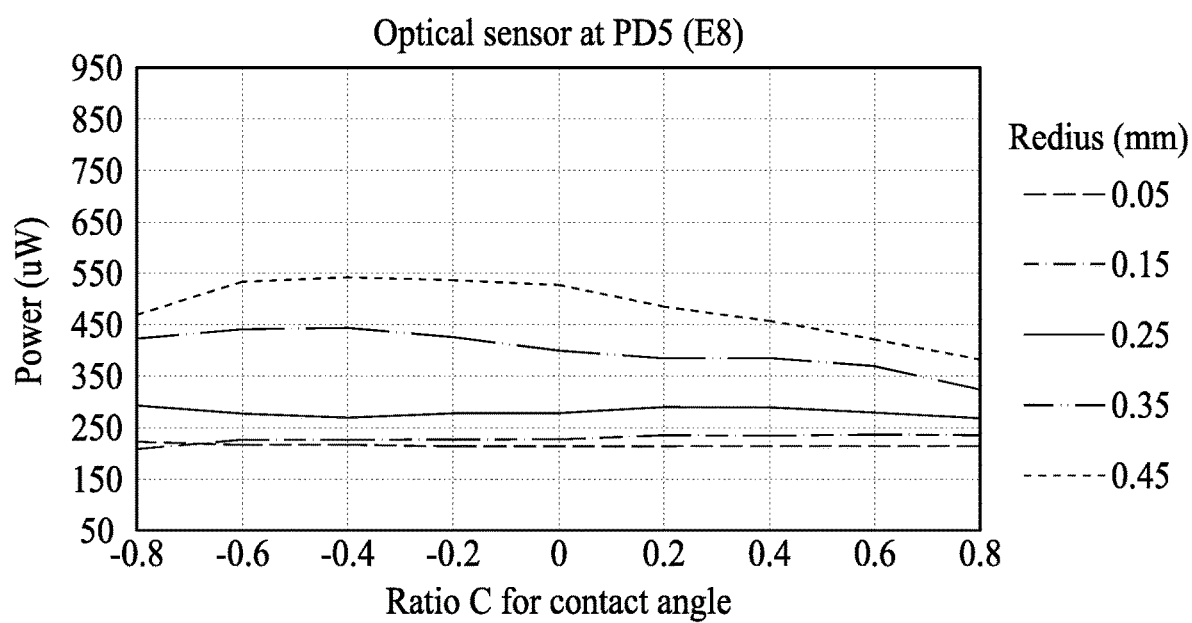

In addition, in exemplary embodiment E8 (i.e., with the optical sensor at position PD5) as shown in FIG. 15G, the simulation curves representing the three water droplets with a radius of 0.35 mm and a radius of 0.45 mm show greater power levels of detected reflected lights, indicating its high sensitivity to detect water droplets having a radius of 0.35 mm or greater.

Figure 16A:
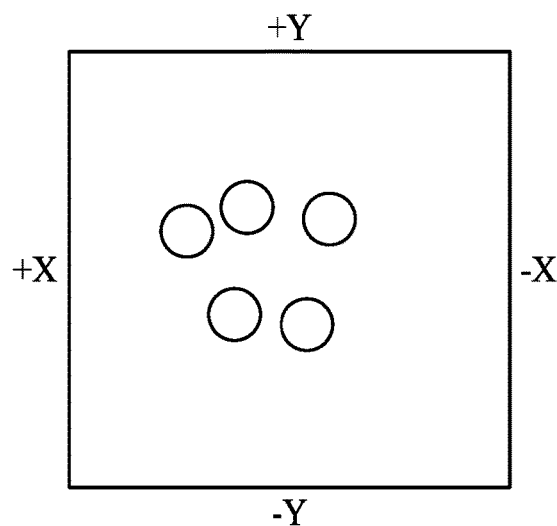
FIG. 16A illustrates a schematic view of water droplets on a diffuser structure of a semiconductor device package in accordance with some embodiments of the present disclosure.
Figure 16B:
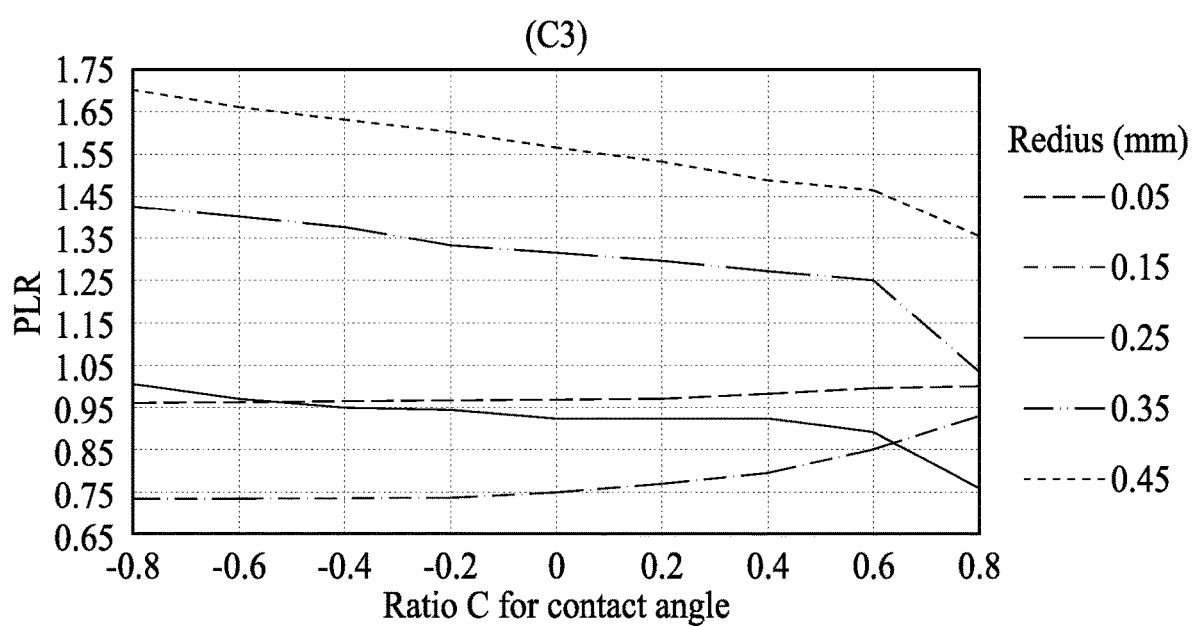
FIG. 16B illustrates the relationship between the Ratio C and the PLR of emitted lights in accordance with some embodiments of the present disclosure.
Figure 16C:
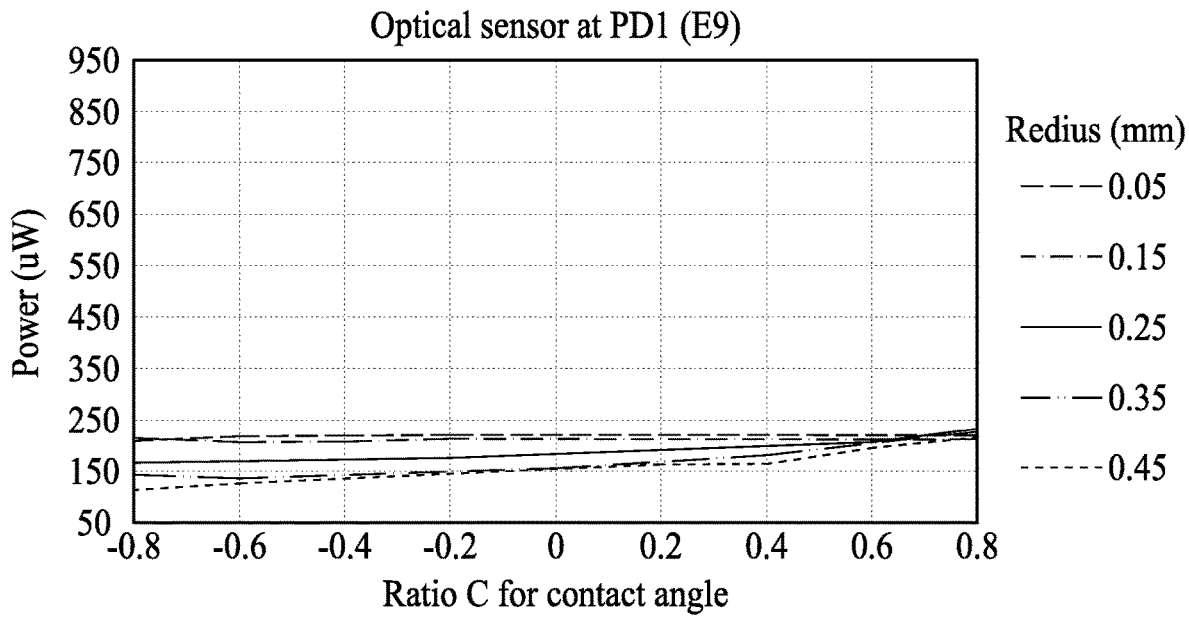
FIG. 16C, FIG. 16D, FIG. 16E, FIG. 16F, and FIG. 16G illustrate the relationships between the Ratio C and the power detected by optical sensors at various positions of a semiconductor device package in accordance with some embodiments of the present disclosure.
Figure 16D:
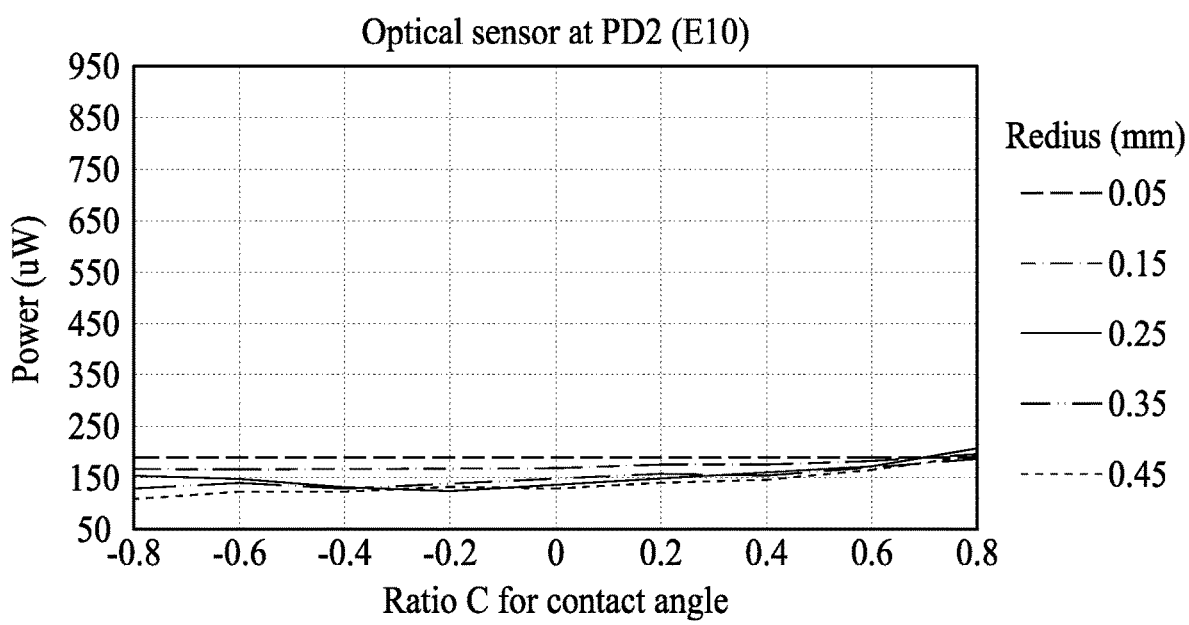
Figure 16E:
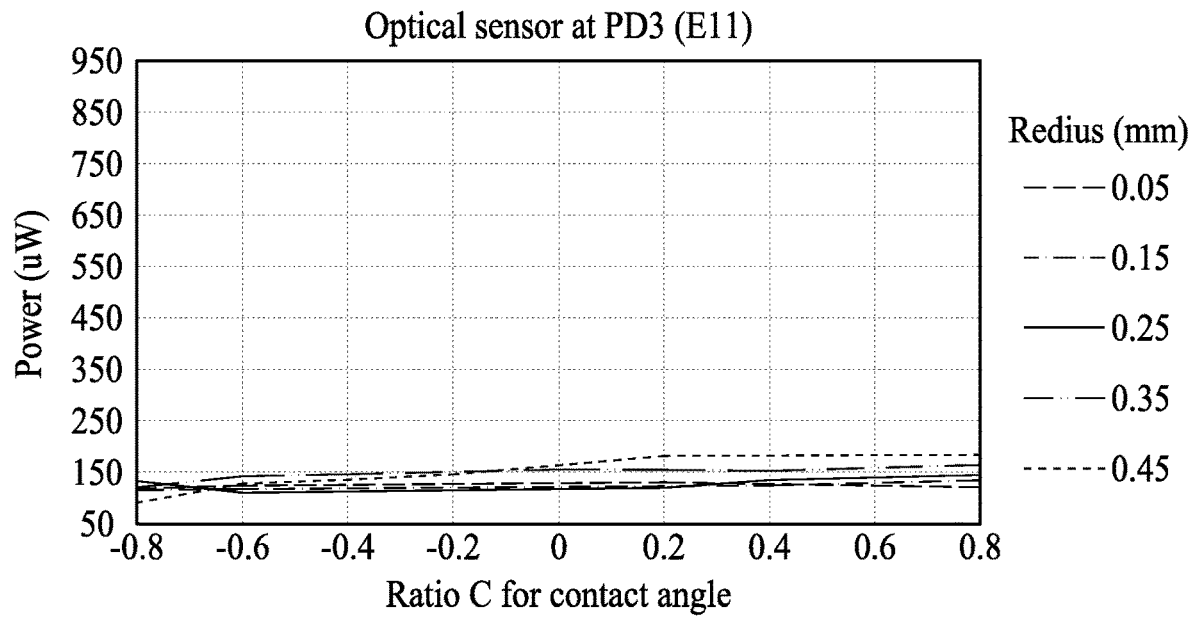

FIGS. 16B, 16C, 16D, 16E, 16F, and 16G show the simulation results of exemplary embodiments C3 and E9-E13 of the present disclosure. Referring to FIG. 13, optical sensors are disposed at positions PD1-PD5 for exemplary embodiments E9-E13, respectively. For exemplary embodiments E9-E13, five water droplets are located on a diffuser structure in an arrangement as shown in FIG. 16A, and the relative coordinates of the five water droplets are listed in table 3. FIG. 16B illustrates the relationship between the Ratio C and the power to limit ratio (PLR) of emitted lights of exemplary embodiment C3. FIGS. 16C, 16D, 16E, 16F, and 16G illustrate the relationships between the Ratio C and the power detected by optical sensors at positions PD1, PD2, PD3, PD4, and PD5 for exemplary embodiments E9, E10, E11, E12, and E13, respectively. Each of the exemplary embodiments is further provided with five simulation curves each representing the three water droplets with a radius of 0.05 mm, 0.15 mm, 0.25 mm, 0.35 mm, and 0.45 mm.

TABLE 2

|  | X(mm) | Y(mm) |
| --- | --- | --- |
| Water droplet 1 | −0.2 | 0.2 |
| Water droplet 2 | −0.1 | −0.25 |
| Water droplet 3 | 0.2 | −0.2-0.3 |
| Water droplet 4 | 0.4 | 0.15 |
| Water droplet 5 | 0.15 | 0.25 |

As illustrated in FIG. 16B, the simulation curve representing the five water droplets with a radius of 0.45 mm shows a greatest PLR level of emitted light, and the simulation curve representing the five water droplets with a radius of 0.35 mm also shows a PLR level of emitted lights that is significantly higher than those of the other three curves in FIG. 16B. Thus, from the results shown in FIG. 16B, water droplets with a greater radius generate a higher PLR level of emitted lights.

Exemplary embodiments E9, E10, E11, E12, and E13 present the simulation results of the power of reflected lights detected by optical sensors adjacent to the light-emitting device. From the simulation results of exemplary embodiments E9-E13 shown in FIGS. 16C-16G, respectively, the power levels of reflected lights detected by optical sensors at different positions PD1, PD2, PD3, PD4, and PD5 vary significantly. While the curves referring to the power detected by the optical sensors at positions PD1 and PD2 (i.e., adjacent to the relatively short side of the light-emitting surface) are smooth with relatively low power levels, the curves referring to the power detected by the optical sensors at positions PD4 and PD5 (i.e., adjacent to the relatively long side of the light-emitting surface) show significantly higher power values. Accordingly, whether water droplets are formed on the diffuser structure within the semiconductor device package can be determined by comparing the power of reflected lights detected by optical sensors at various positions (e.g., positions PD1 and PD5) and verifying if the difference between the power values detected from different positions exceeds a predetermined level.

Figure 16F:
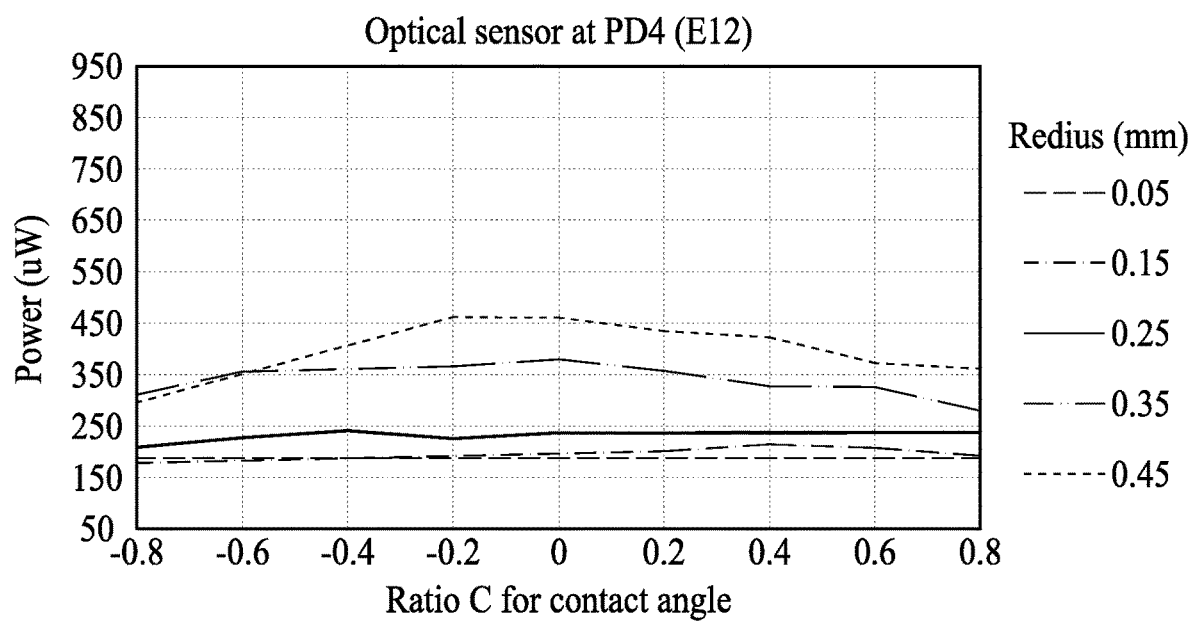
Figure 16G:
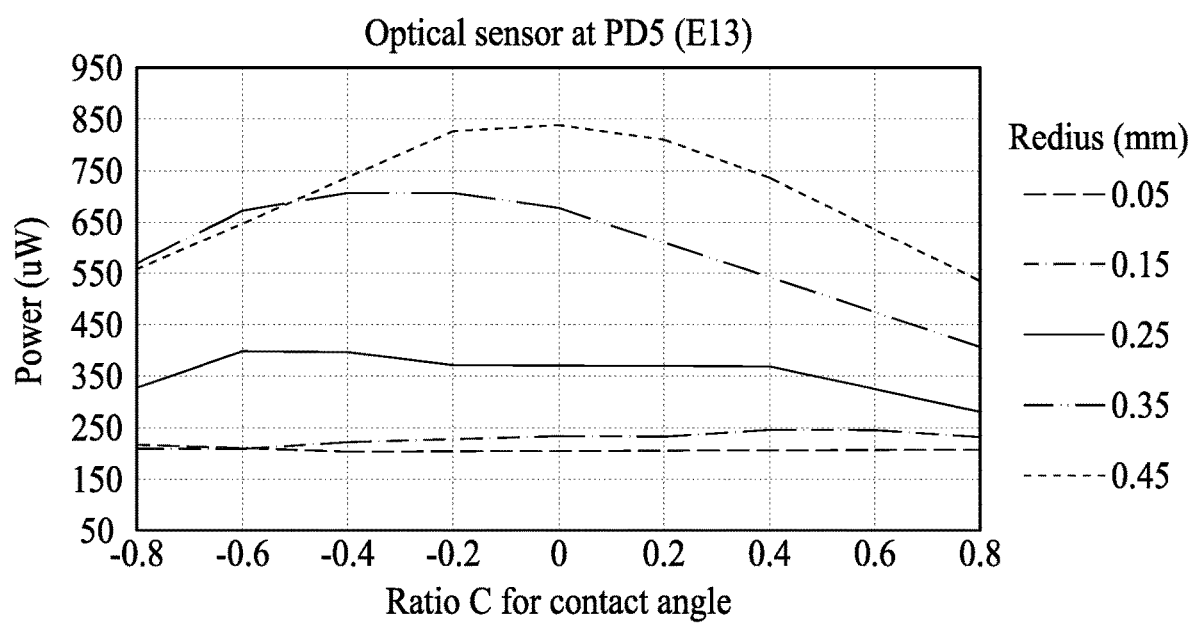
Figure 17:
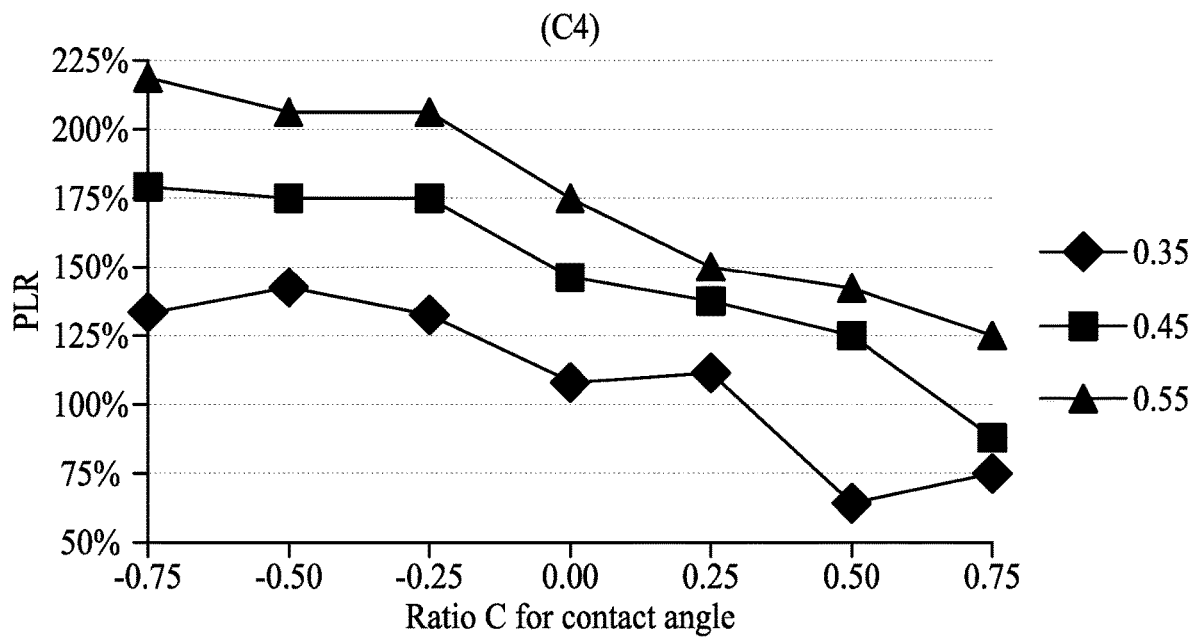
FIG. 17, FIG. 18A, FIG. 18B, FIG. 18C, FIG. 18D, and FIG. 18E illustrate the relationships between the Ratio C and the PLR detected by optical sensors at various positions of a semiconductor device package in accordance with some embodiments of the present disclosure.
Figure 18A:
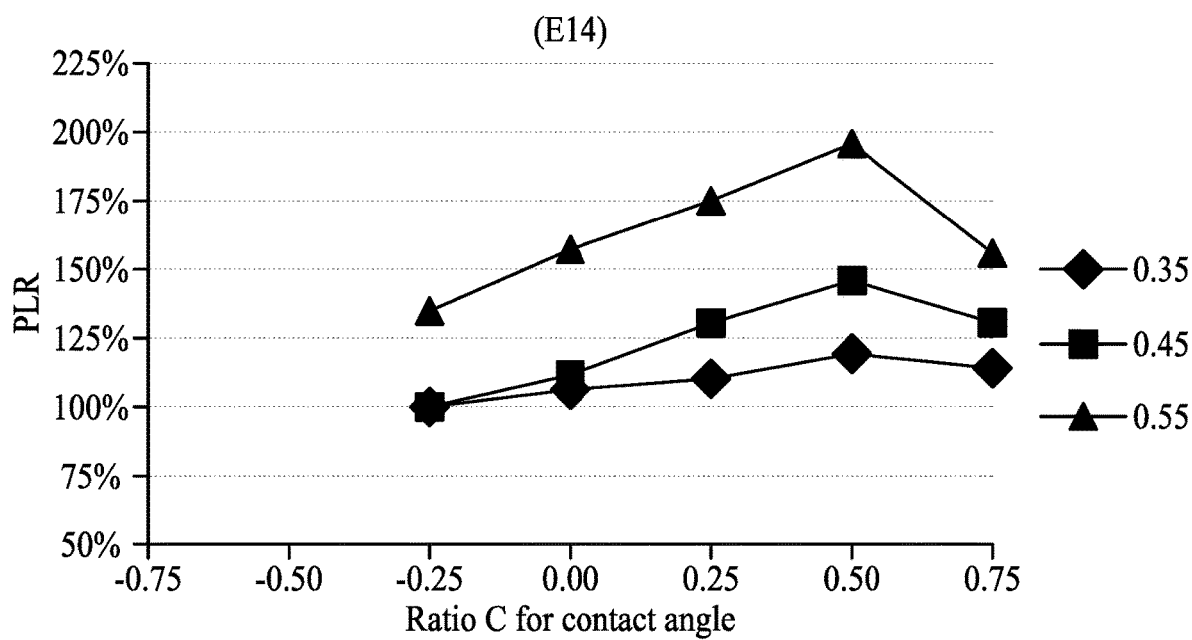
Figure 18B:
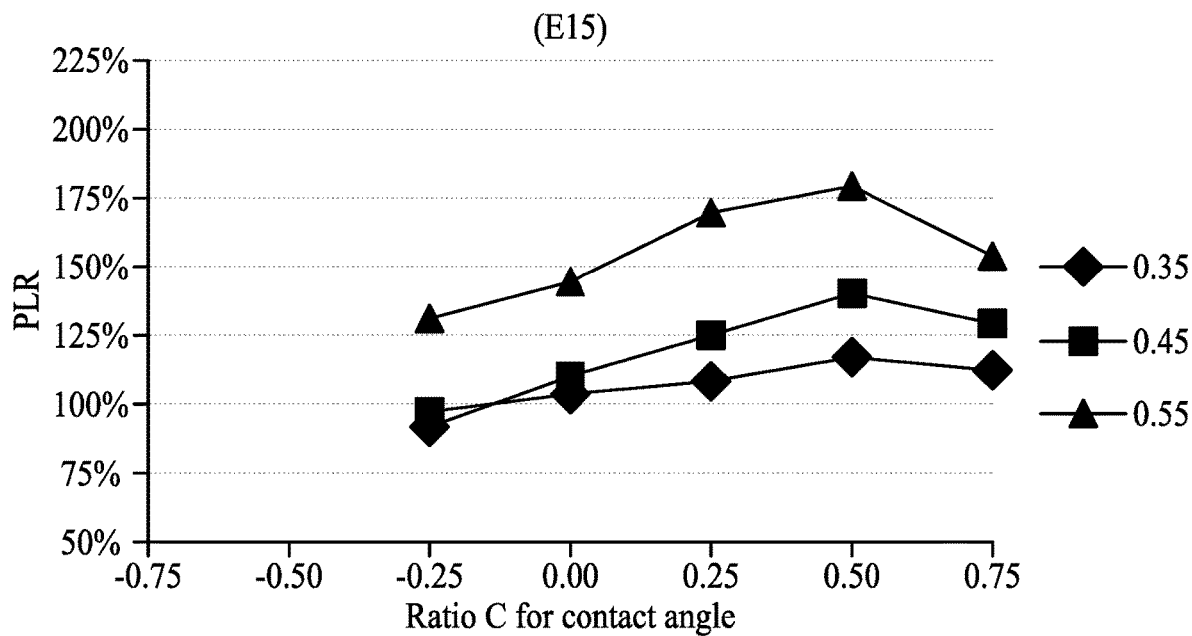
Figure 18C:
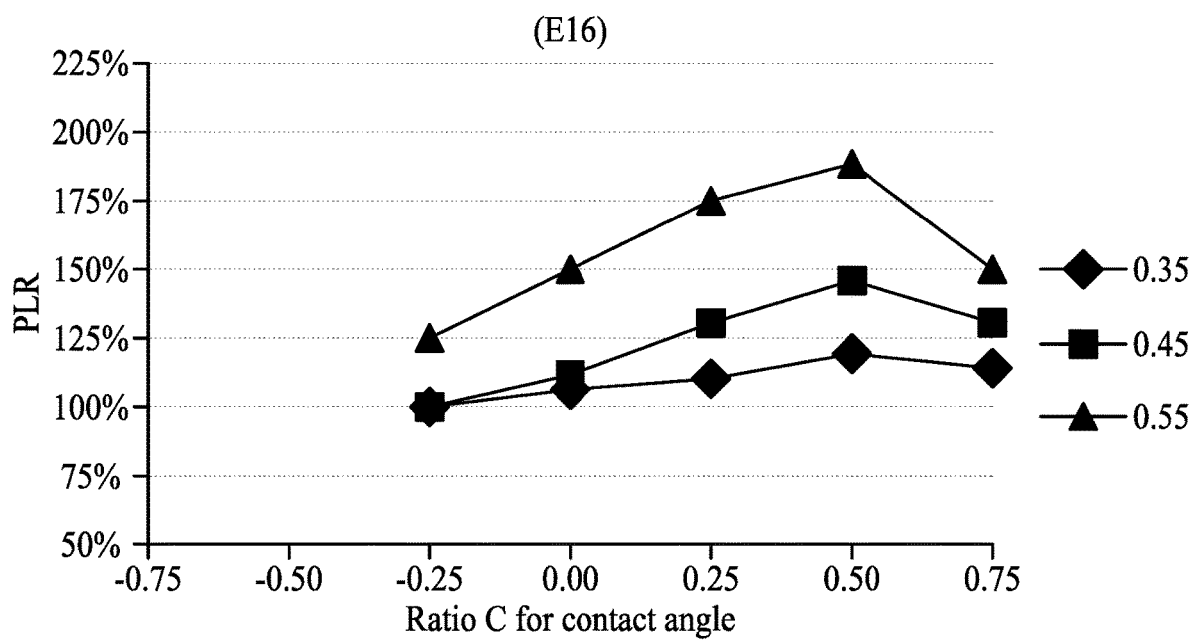
Figure 18D:
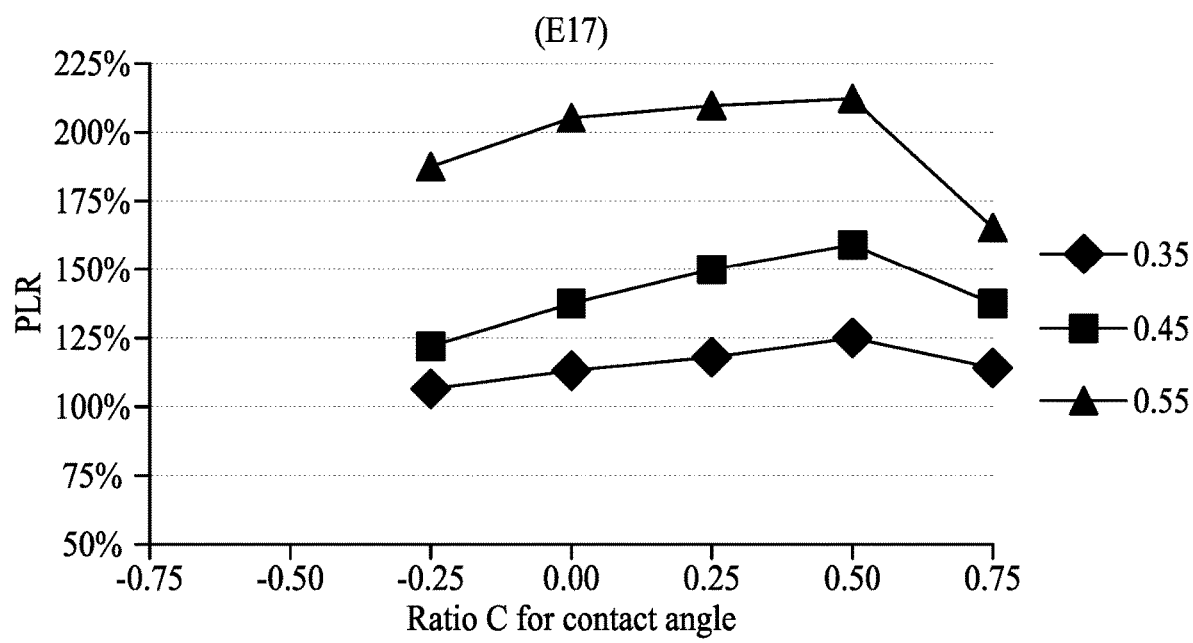
Figure 18E:
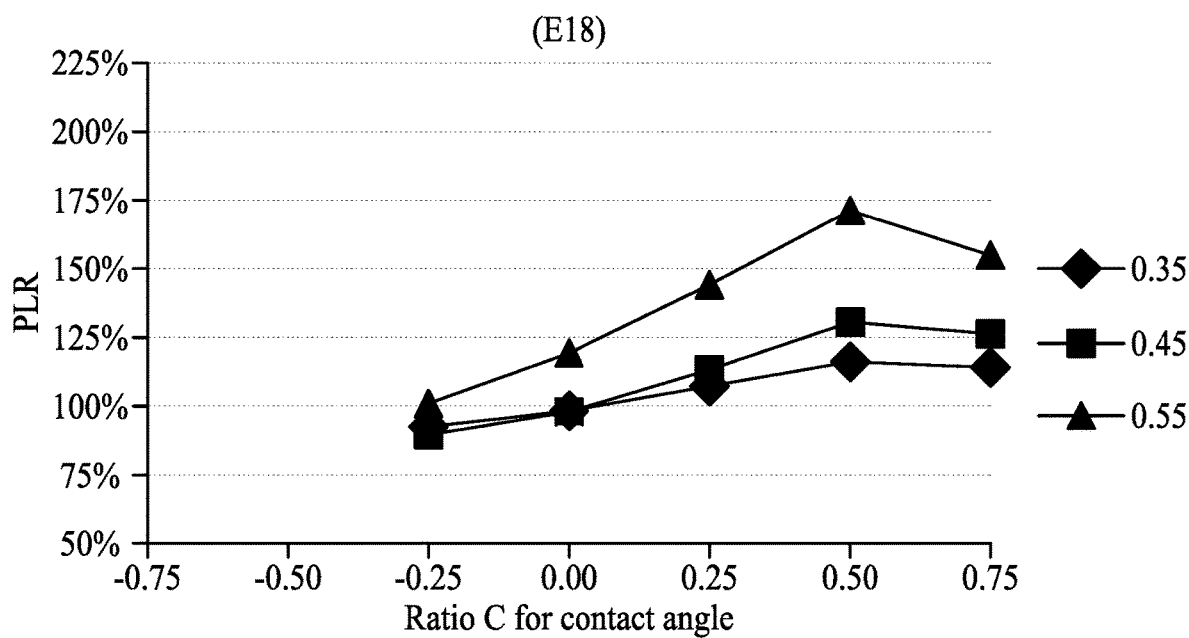

In addition, in exemplary embodiments E12 and E13 (i.e., with the optical sensors at positions PD4 and PD5) as shown in FIGS. 16F-16G, the simulation curves representing the five water droplets with a radius of 0.35 mm and a radius of 0.45 mm show greater power levels of detected reflected lights, indicating its high sensitivity to detect water droplets having a radius of 0.35 mm or greater.

FIGS. 17, 18A, 18B, 18C, 18D, and 18E show the simulation results of exemplary embodiments C4 and E14-E18 of the present disclosure. Referring to the top view in FIG. 13, the optical sensors for exemplary embodiments C4 and E14 are disposed at position PD5, the optical sensor for exemplary embodiment E15 is disposed between the side 111 and the position PD5, the optical sensor for exemplary embodiment E16 is disposed between the position PD5 and the housing structure 500, the optical sensor for exemplary embodiment E17 is disposed on a side of the position PD5 away from the position PD4, and the optical sensor for exemplary embodiment E18 is disposed between the position PD5 and the position PD4. In addition, the optical sensor for exemplary embodiment C4 directly contacts the base layer of the housing structure 500, and the optical sensors for exemplary embodiments E14-E18 are disposed on an elevating layer and spaced apart from the base layer by the elevating layer. FIGS. 17, 18A, 18B, 18C, 18D, and 18E illustrate the relationships between the Ratio C and the PLR detected by optical sensors at various positions, which are proximate to position PD5, for exemplary embodiments E9, E10, E11, E12, and E13, respectively. Each of the exemplary embodiments is further provided with three simulation curves each representing the presence of a water droplet with a radius of 0.35 mm, 0.45 mm, and 0.55 mm.

From the simulation results illustrated in FIGS. 17, 18A, 18B, 18C, 18D, and 18E for exemplary embodiments C4 and E9-E13, it is apparent that the elevated optical sensors are provided with higher sensitivity to the presence of a water droplet having a Ratio C of 0.25 or higher (i.e., larger water contact angle).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

The invention claimed is:

1. A semiconductor device package, comprising:
   a light-emitting device having a light-emitting surface, wherein the light-emitting surface of the light-emitting device has a first side and a second side angled with the first side, and a length of the first side of the light-emitting surface is greater than a length of the second side of the light-emitting surface;
   a diffuser structure above the light-emitting surface of the light-emitting device; and
   an optical sensor disposed below the diffuser structure and adjacent to the first side of the light-emitting surface, the optical sensor being configured to detect a reflected light reflected by the diffuser structure;
   wherein the diffuser structure comprises a micro lens array on a first surface facing the light-emitting surface of the light-emitting device and a convex lens on a second surface opposite to the first surface.

2. The semiconductor device package as claimed in claim 1, further comprising:
   a housing structure, wherein the diffuser structure is disposed on the housing structure, and the housing structure and the diffuser structure define an enclosing space to accommodate the light-emitting device and the optical sensor.

3. The semiconductor device package as claimed in claim 2, further comprising:
   an elevating layer disposed between the optical sensor and a base layer of the housing structure, wherein the light-emitting device directly contacts the base layer of the housing structure.

4. The semiconductor device package as claimed in claim 1, further comprising:
   a temperature sensor disposed below the diffuser structure, the temperature sensor being configured to detect a temperature of the semiconductor device package.

5. The semiconductor device package as claimed in claim 4, further comprising a processing unit coupled to the optical sensor and the temperature sensor, wherein
   the processing unit is configured to generate a relative change in light intensity according to a light intensity of the reflected light and a relative change in temperature according to the temperature detected by the temperature sensor; and
   the processing unit is configured to determine whether the relative change in light intensity and the relative change in temperature meet a predetermined criterion or not.

6. The semiconductor device package as claimed in claim 4, wherein the light-emitting device comprises a surface light-emitting laser element, and the temperature sensor comprises a thermistor.

7. A semiconductor device package, comprising:
   a light-emitting device comprising a surface light-emitting laser element;
   a diffuser structure above the light-emitting device, wherein a light emitted by the light-emitting device and reflected by the diffuser structure forms a luminous intensity pattern, and the luminous intensity pattern has a first region having a maximum light intensity and a second region having a light intensity that is 10% to 30% of the maximum light intensity of the first region; and
   an optical sensor disposed in the second region of the luminous intensity pattern, the optical sensor being configured to detect a reflected light reflected by the diffuser structure,
   wherein the diffuser structure comprises a micro lens array on a first surface facing a light-emitting surface of the light-emitting device and a convex lens on a second surface opposite to the first surface.

8. The semiconductor device package as claimed in claim 7, wherein the light intensity of the second region is 15% to 25% of the maximum light intensity of the first region.

9. The semiconductor device package as claimed in claim 7, further comprising a processing unit coupled to the optical sensor, wherein
   the processing unit is configured to generate a relative change in light intensity according to a light intensity of the reflected light; and
   the processing unit is configured to determine whether the relative change in light intensity meets a predetermined criterion or not.

10. The semiconductor device package as claimed in claim 7, wherein the second region of the luminous intensity pattern has a circular ring shape and surrounds the first region of the luminous intensity pattern.

11. A semiconductor device package, comprising:
    a light-emitting device having a light-emitting surface, wherein the light-emitting surface of the light-emitting device has a first side and a second side angled with the first side, and a length of the first side of the light-emitting surface is greater than a length of the second side of the light-emitting surface;

a diffuser structure above the light-emitting surface of the light-emitting device, wherein the diffuser structure comprises a micro lens array on a first surface facing the light-emitting surface of the light-emitting device and a convex lens on a second surface opposite to the first surface; and an optical sensor disposed below the diffuser structure and adjacent to the first side of the light-emitting surface, the optical sensor being configured to detect a reflected light reflected by the diffuser structure.

12. A semiconductor device package, comprising:

a light-emitting device having a light-emitting surface;

a diffuser structure above the light-emitting surface of the light-emitting device, wherein the diffuser structure comprises a micro lens array on a first surface facing the light-emitting surface of the light-emitting device and a convex lens on a second surface opposite to the first surface, a light emitted by the light-emitting device and reflected by the diffuser structure forms a luminous intensity pattern, and the luminous intensity pattern has a first region having a maximum light intensity and a second region having a light intensity that is 10% to 30% of the maximum light intensity of the first region; and an optical sensor disposed in the second region of the luminous intensity pattern, the optical sensor being configured to detect a reflected light reflected by the diffuser structure.

* * * * *